(12) United States Patent
Ikeda

(10) Patent No.: US 11,121,135 B1
(45) Date of Patent: Sep. 14, 2021

(54) STRUCTURE OF MEMORY DEVICE

(71) Applicant: Winbond Electronics Corp., Taichung (TW)

(72) Inventor: Noriaki Ikeda, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/874,680

(22) Filed: May 15, 2020

(51) Int. Cl.
*H01L 21/00* (2006.01)
*H01L 27/108* (2006.01)
*H01L 21/762* (2006.01)
*H01L 23/532* (2006.01)
*H01L 23/528* (2006.01)
*H01L 49/02* (2006.01)

(52) U.S. Cl.
CPC .. *H01L 27/10814* (2013.01); *H01L 21/76224* (2013.01); *H01L 23/528* (2013.01); *H01L 23/53266* (2013.01); *H01L 23/53271* (2013.01); *H01L 23/53295* (2013.01); *H01L 27/1085* (2013.01); *H01L 27/10885* (2013.01); *H01L 27/10888* (2013.01); *H01L 27/10894* (2013.01); *H01L 28/60* (2013.01)

(58) Field of Classification Search
CPC .............. H01L 27/10814; H01L 23/528; H01L 27/10888
See application file for complete search history.

(56) References Cited

U.S. PATENT DOCUMENTS

| 9,356,073 | B1 * | 5/2016 | Kim | H01L 21/76805 |
| 10,068,907 | B1 * | 9/2018 | Tsai | H01L 27/10855 |
| 10,734,390 | B1 * | 8/2020 | Park | H01L 21/76802 |
| 2003/0107076 | A1 * | 6/2003 | Lin | H01L 28/60 257/309 |
| 2003/0132438 | A1 * | 7/2003 | Jang | H01L 29/945 257/68 |
| 2015/0126013 | A1 * | 5/2015 | Hwang | H01L 23/5226 438/381 |
| 2015/0235950 | A1 * | 8/2015 | Han | H01L 27/10888 257/773 |
| 2018/0047732 | A1 * | 2/2018 | Kim | H01L 21/76841 |
| 2018/0122809 | A1 * | 5/2018 | Lin | H01L 27/10897 |
| 2018/0342517 | A1 * | 11/2018 | Takesako | H01L 23/53257 |

(Continued)

FOREIGN PATENT DOCUMENTS

CN 209216973 8/2019

*Primary Examiner* — Laura M Menz
(74) *Attorney, Agent, or Firm* — JCIPRNET

(57) ABSTRACT

A structure of memory cell includes a substrate. The substrate includes a first active region, a second active region and a first shallow trench isolation (STI) structure between the first active region and the second active region, wherein the first active region is lower than the second active region. A first contact structure is disposed on the first active region. A first stack structure is on the first contact structure. A second contact structure is on the substrate with a bottom portion in the substrate at an interface between the second active region and the first STI structure. A dielectric spacer is at least on a sidewall of the first contact structure. An insulating layer is disposed on the dielectric spacer and between the second contact structure and the first contact structure with the first stack structure, wherein a dielectric constant of the dielectric spacer is lower than a dielectric constant of the insulating layer.

20 Claims, 34 Drawing Sheets

(56) References Cited

U.S. PATENT DOCUMENTS

| | | | |
|---|---|---|---|
| 2019/0019795 A1* | 1/2019 | Takesako | H01L 21/76224 |
| 2019/0043864 A1* | 2/2019 | Takesako | H01L 27/10891 |
| 2019/0096890 A1* | 3/2019 | Lee | H01L 27/10855 |
| 2019/0348420 A1* | 11/2019 | Yen | H01L 27/10823 |
| 2020/0303240 A1* | 9/2020 | Chang | H01L 21/76224 |
| 2020/0335506 A1* | 10/2020 | Chien | H01L 27/10885 |
| 2020/0381439 A1* | 12/2020 | Ikeda | H01L 27/10897 |
| 2020/0388618 A1* | 12/2020 | Ikeda | H01L 27/10855 |
| 2021/0005614 A1* | 1/2021 | Lin | H01L 27/10876 |

\* cited by examiner

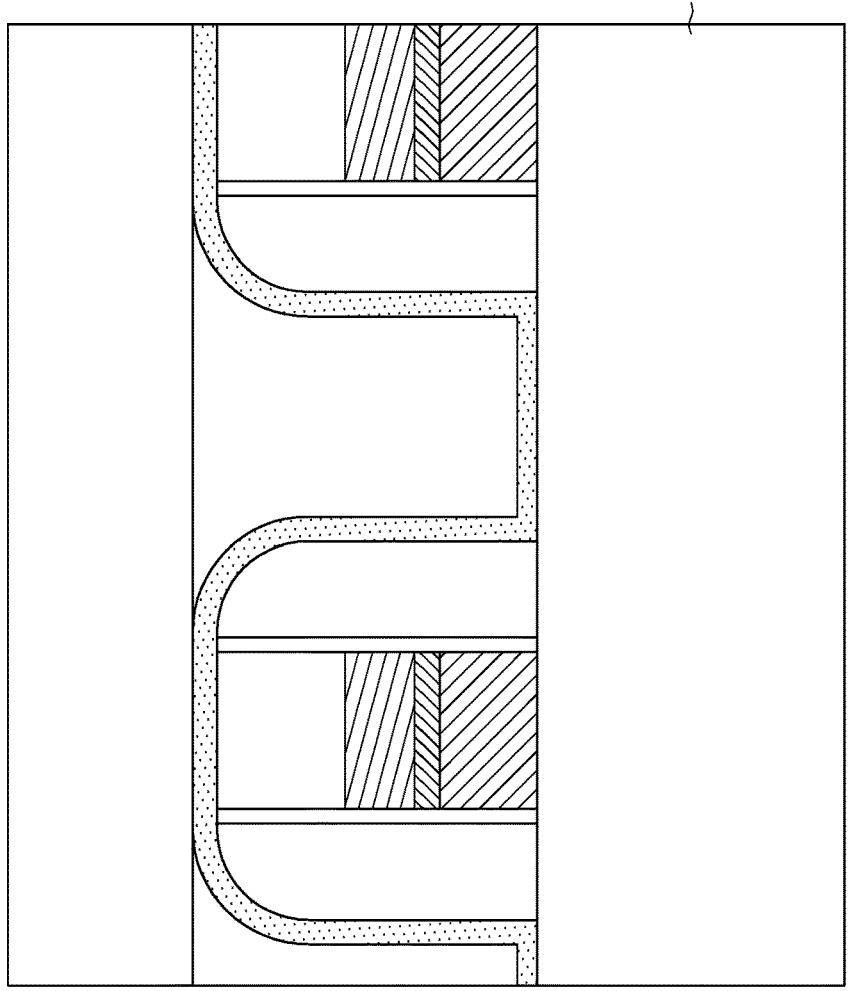
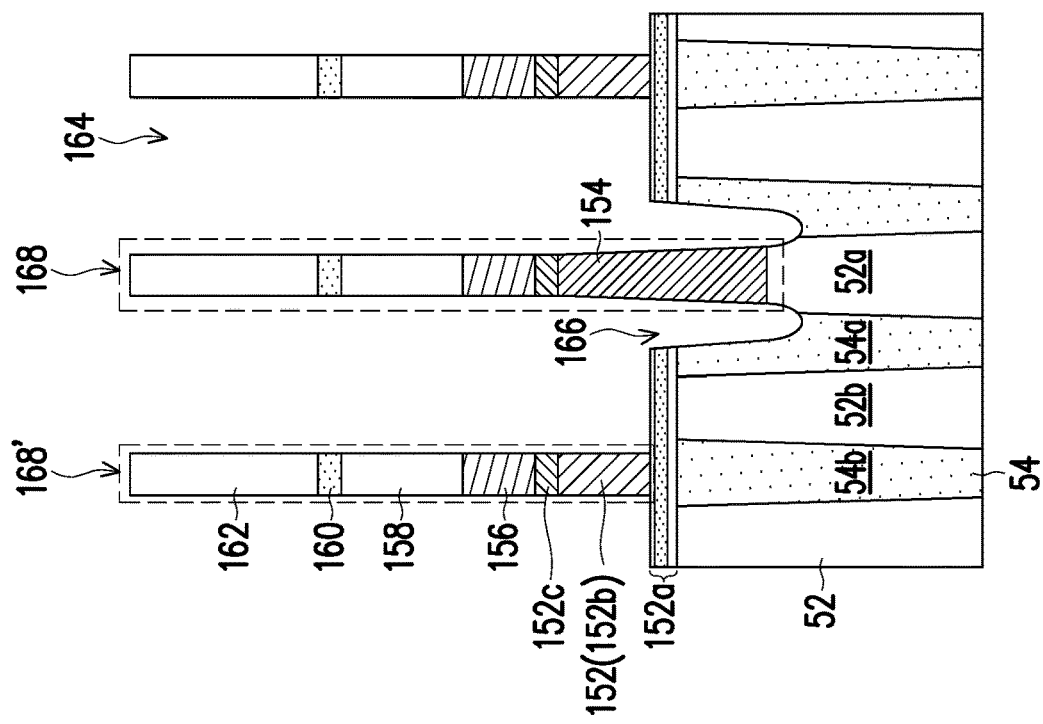
FIG. 5B

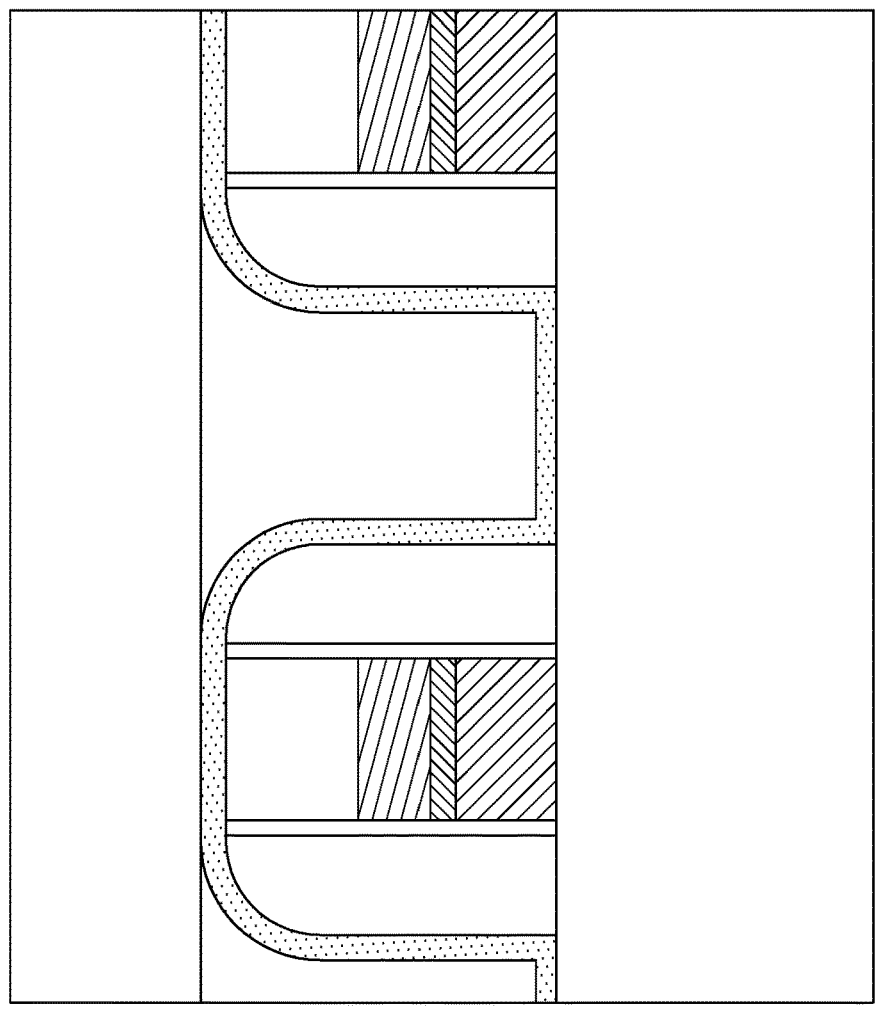
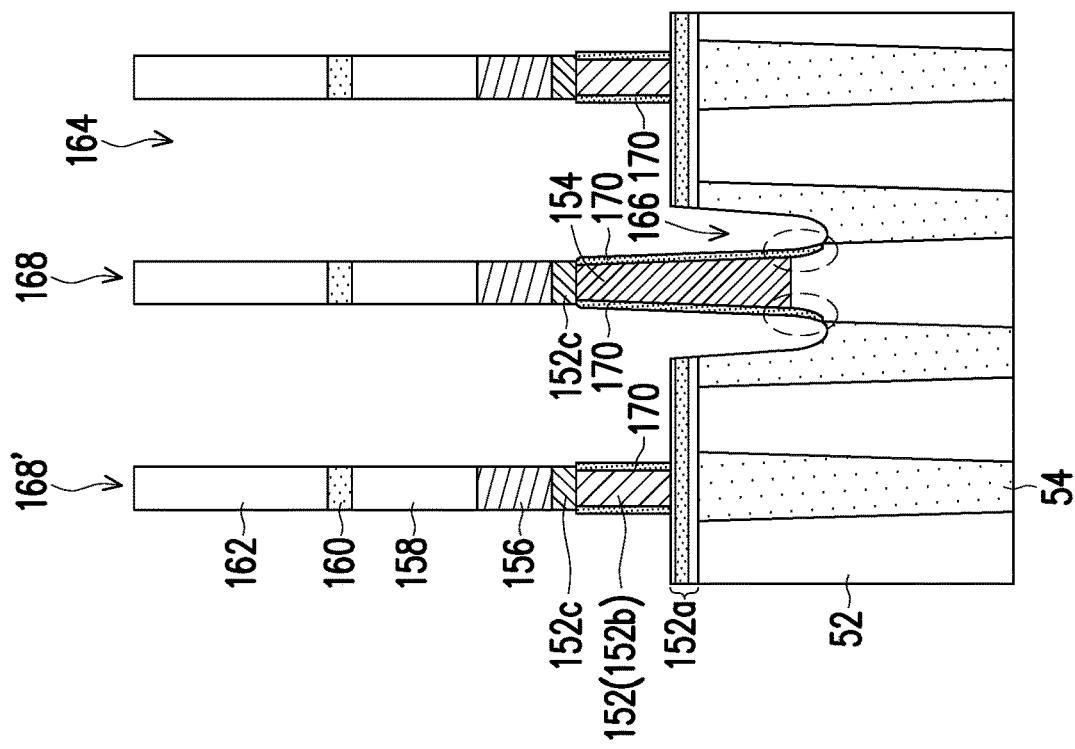
FIG. 5C

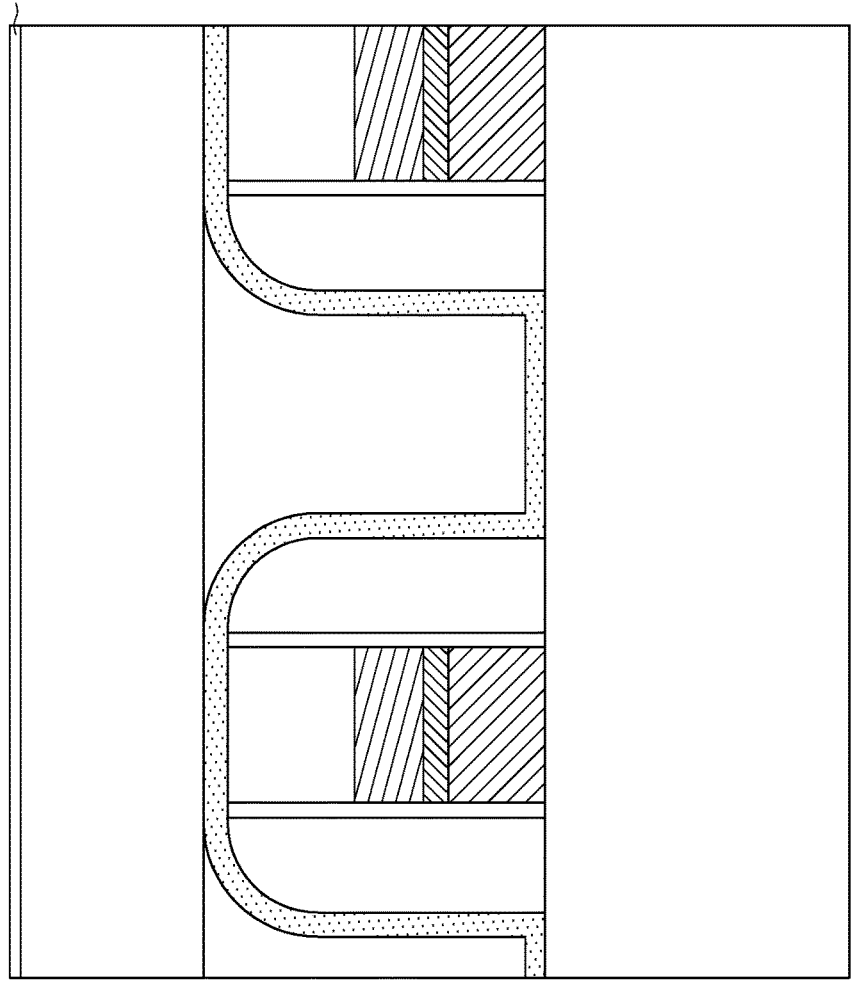
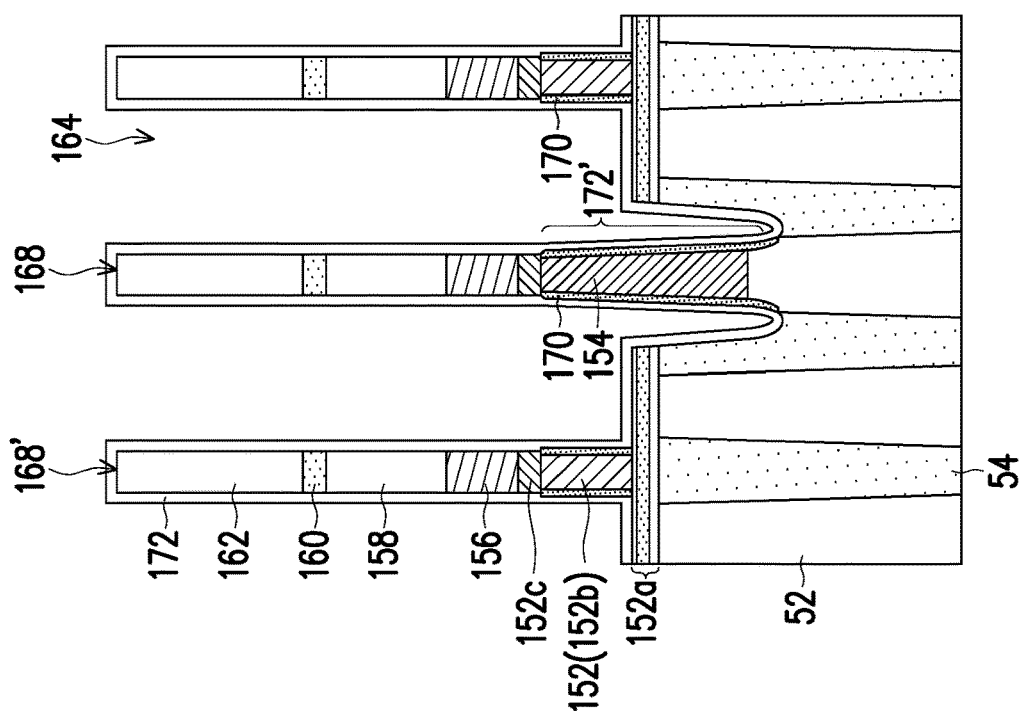
FIG. 5D

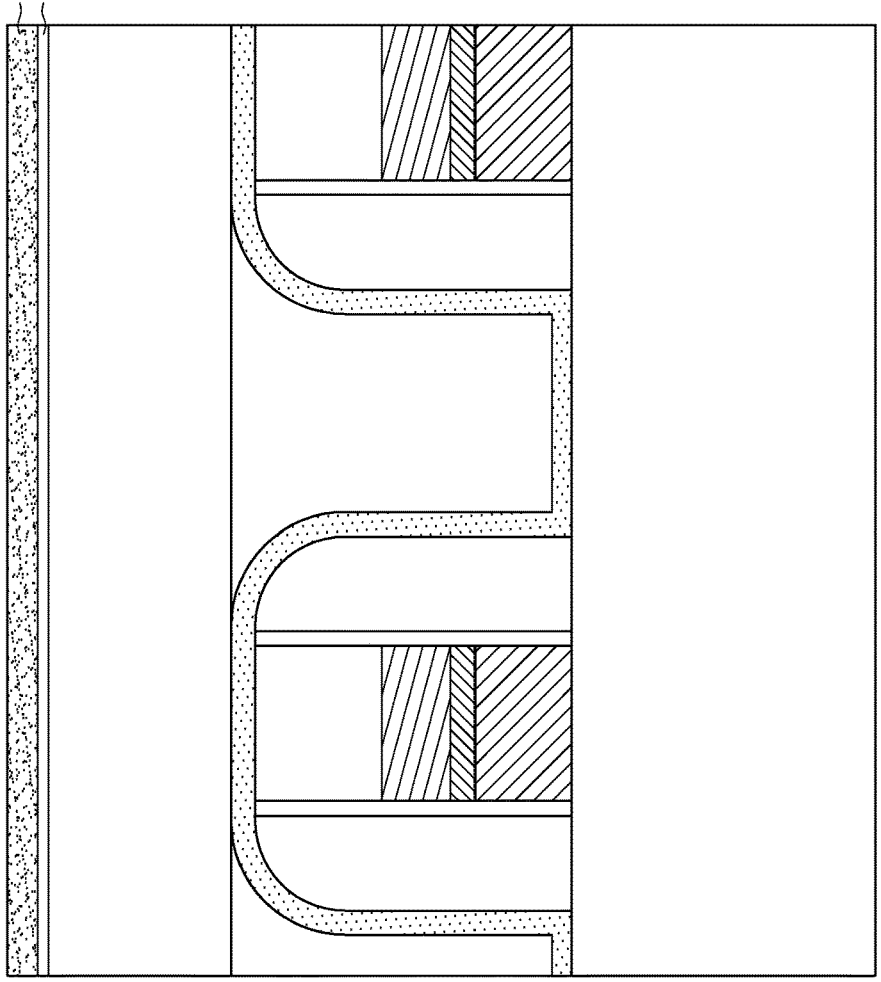
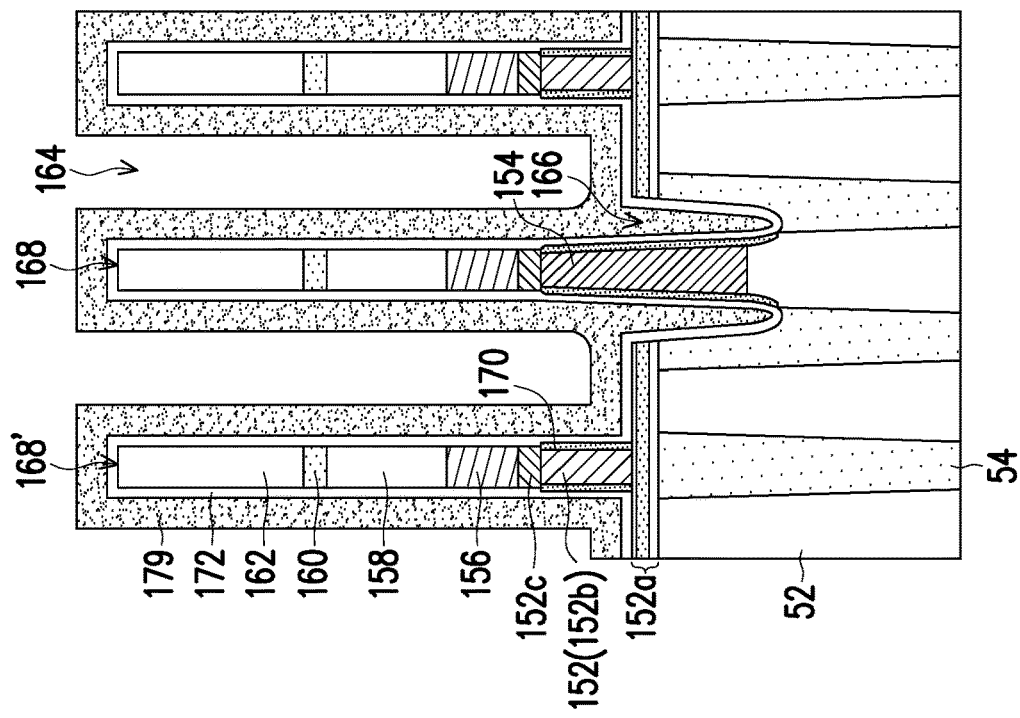
FIG. 5E

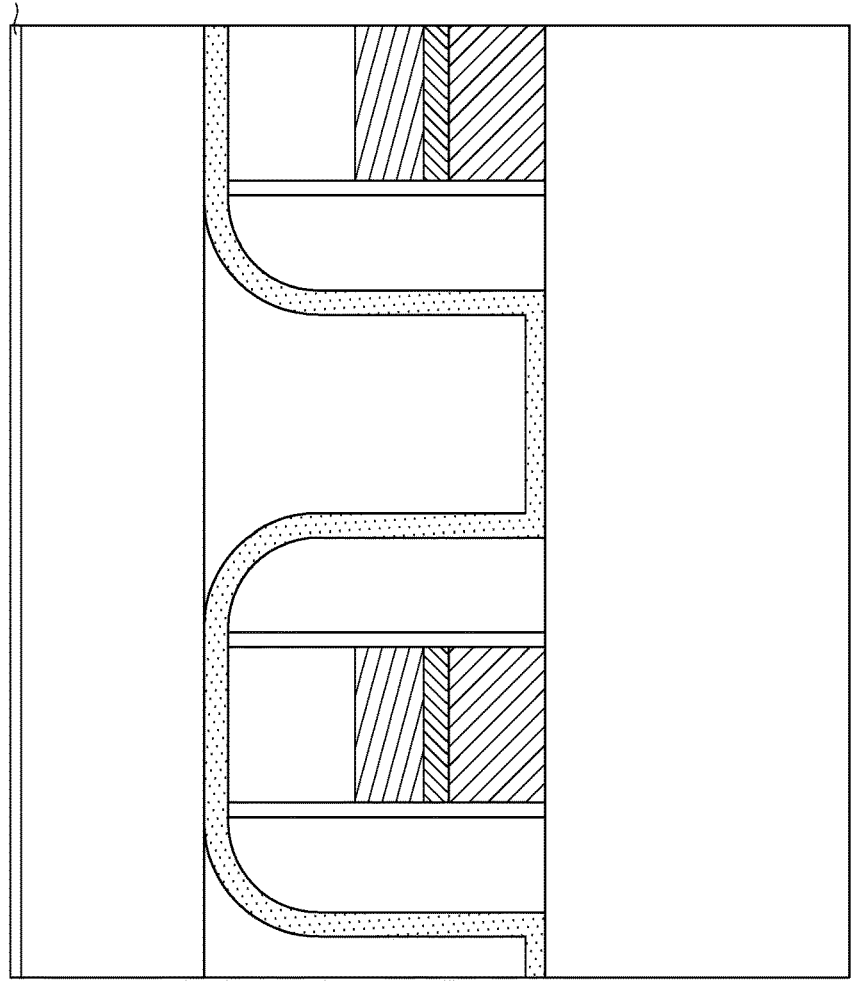
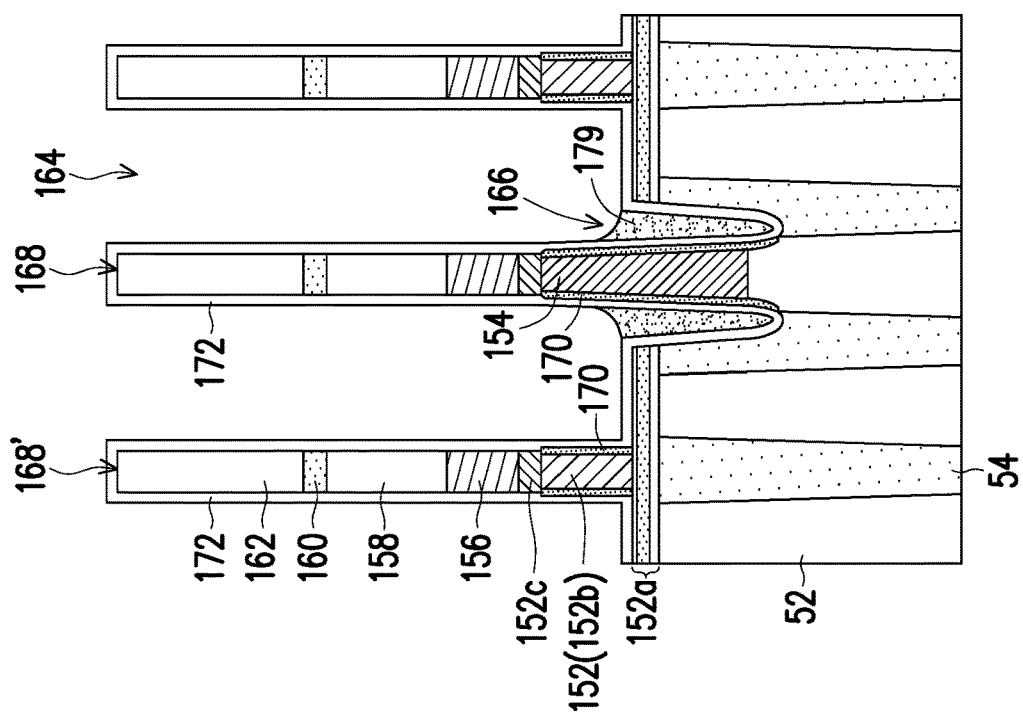
FIG. 5F

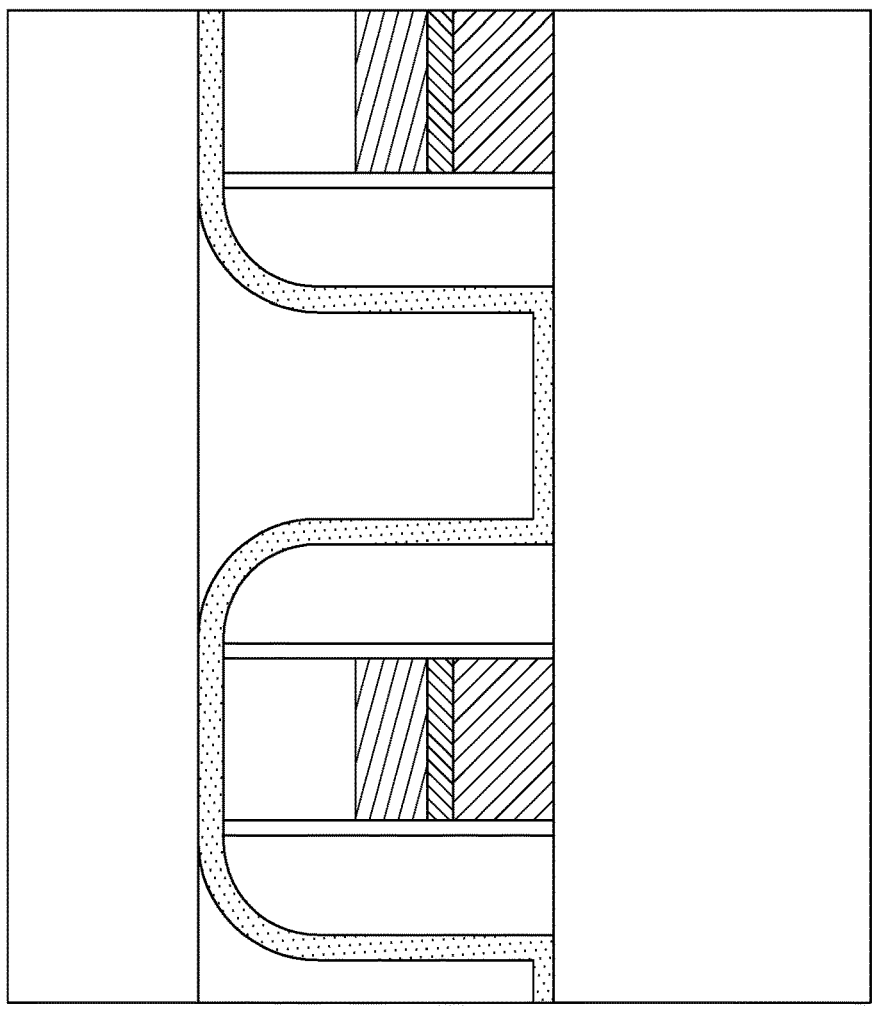
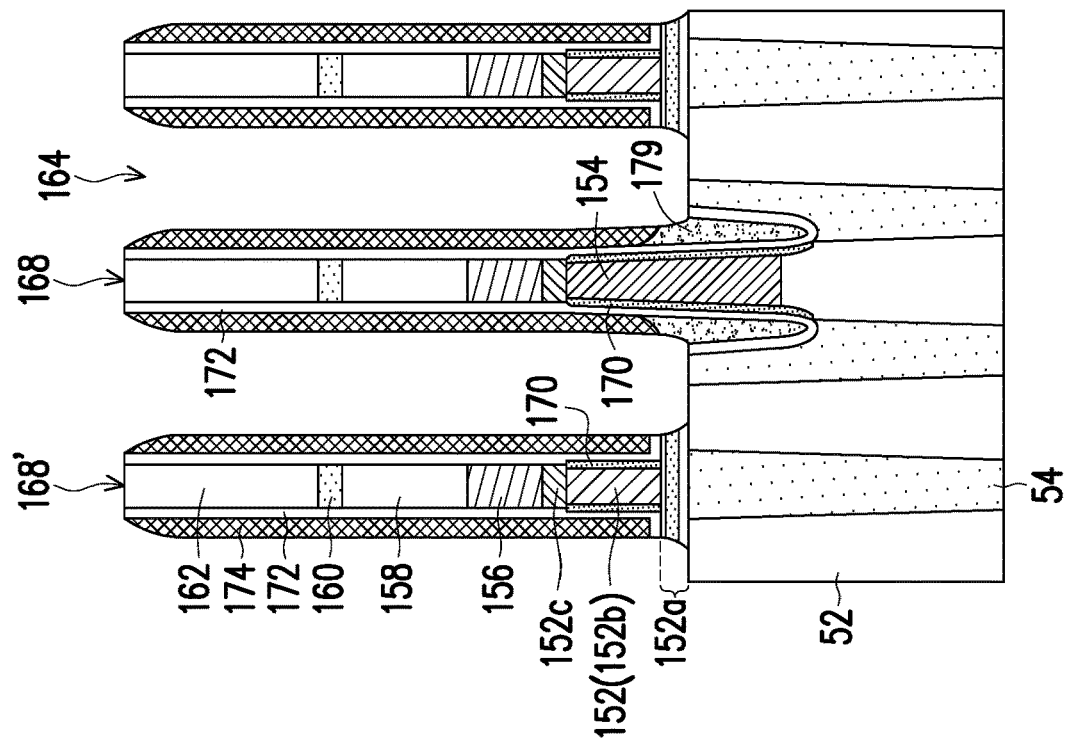
FIG. 5G

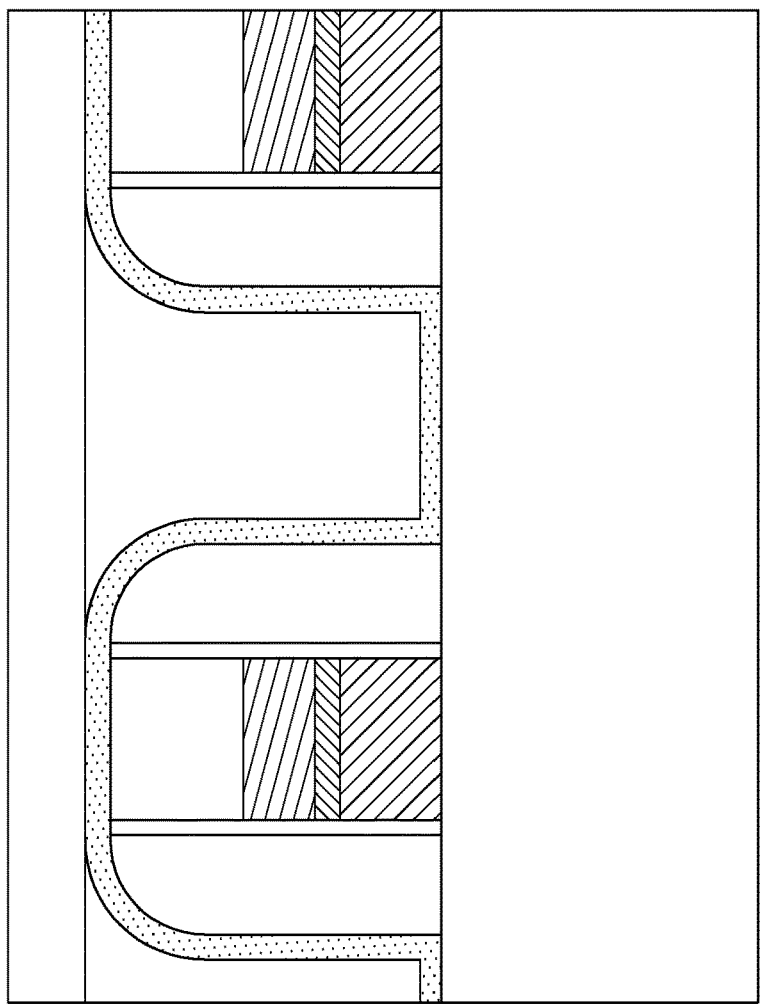
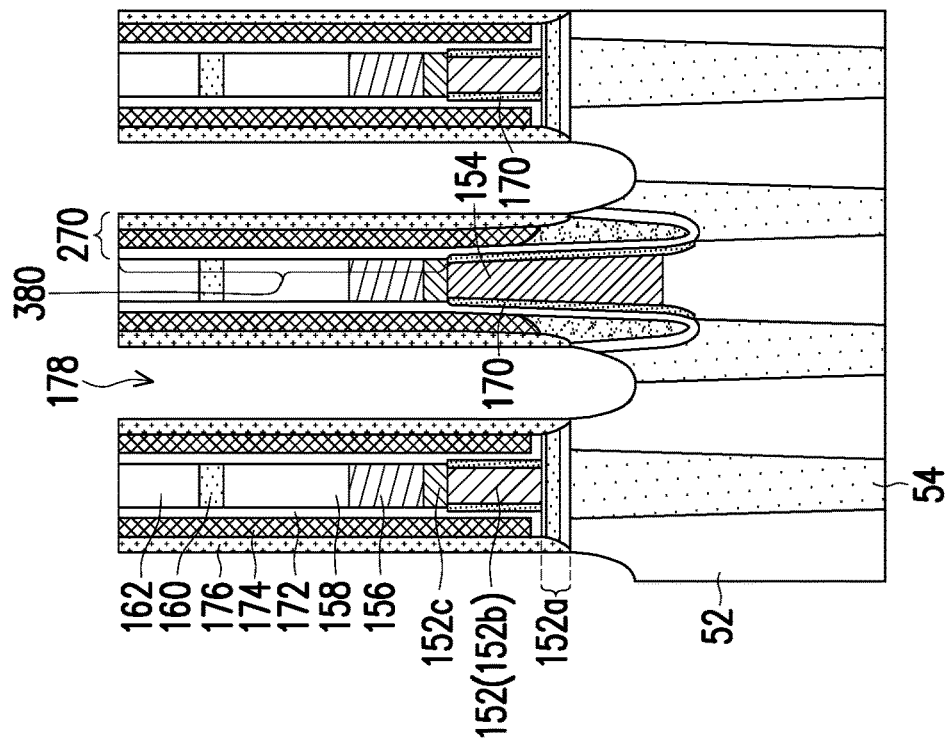
FIG. 5H

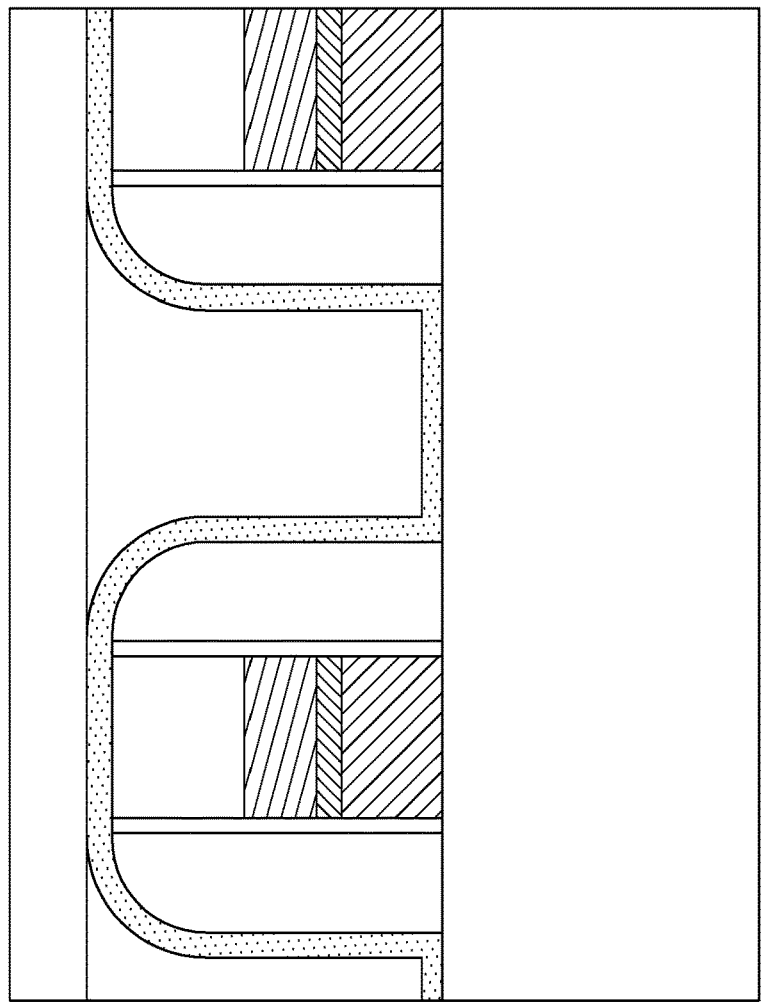
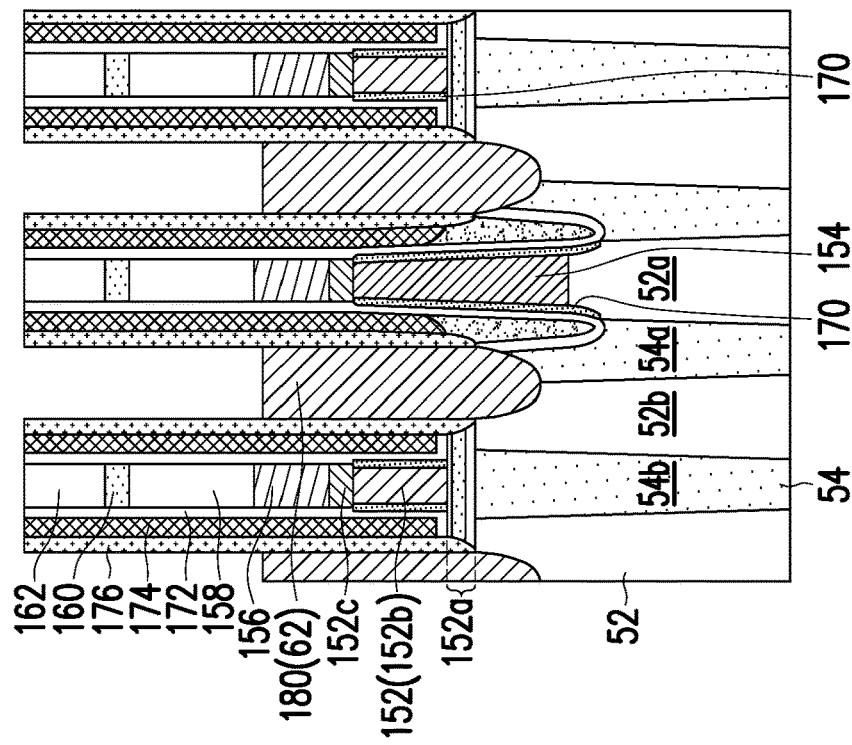
FIG. 5J

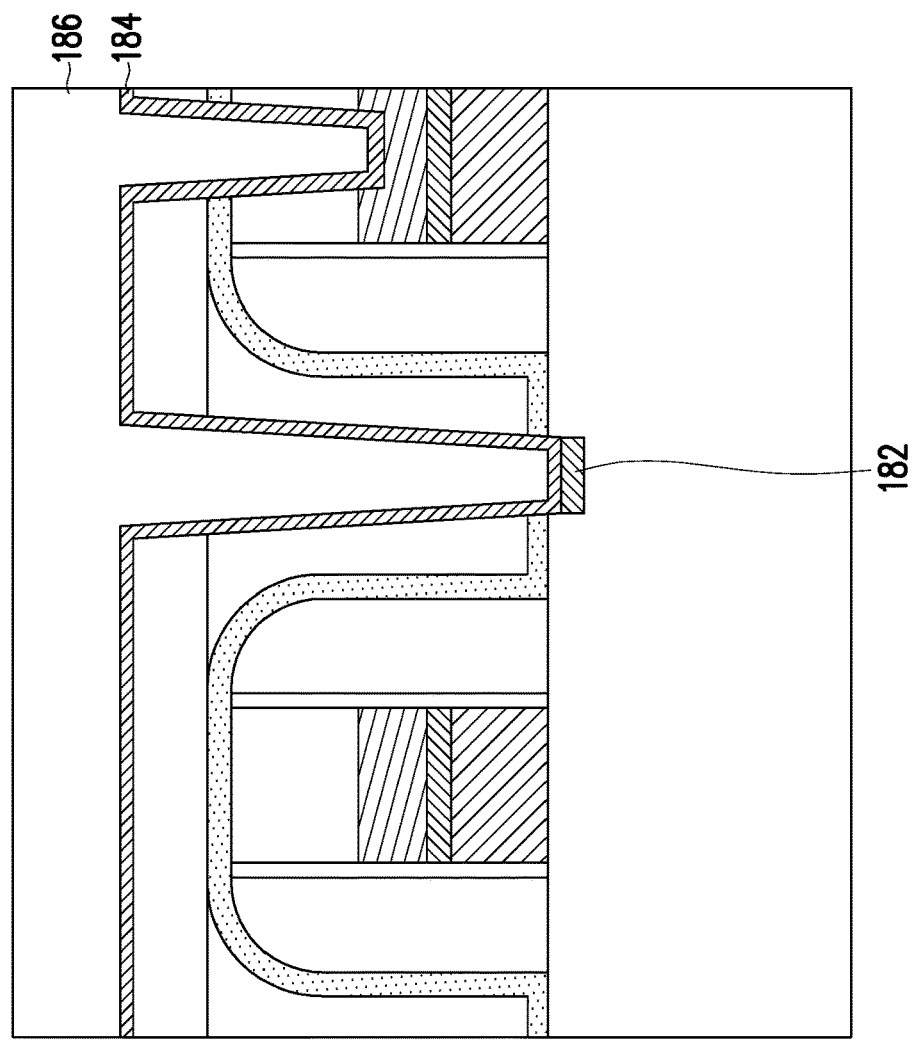
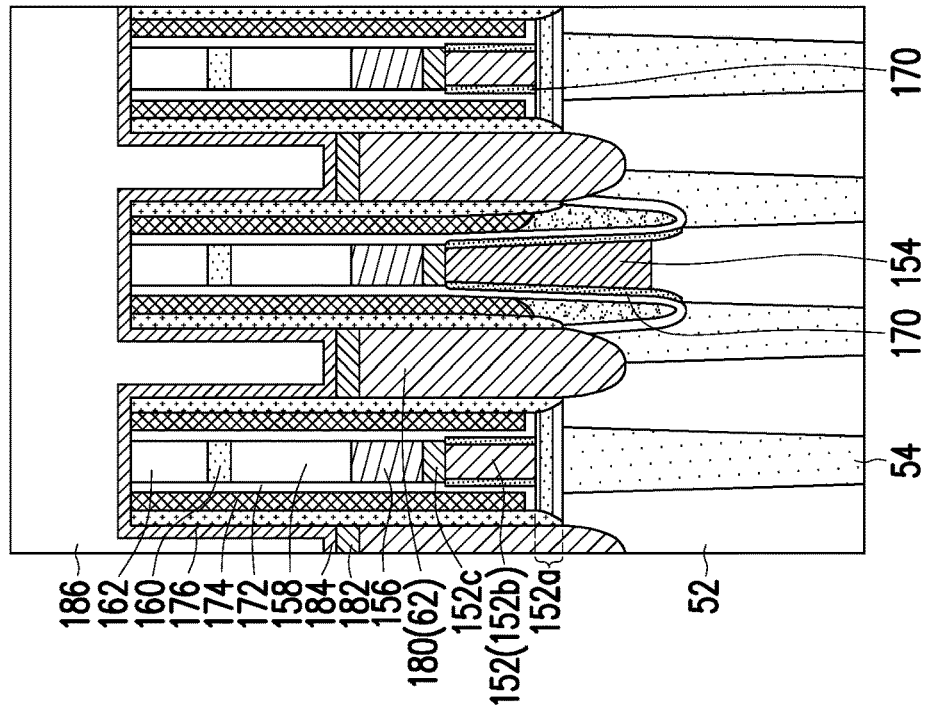
FIG. 5K

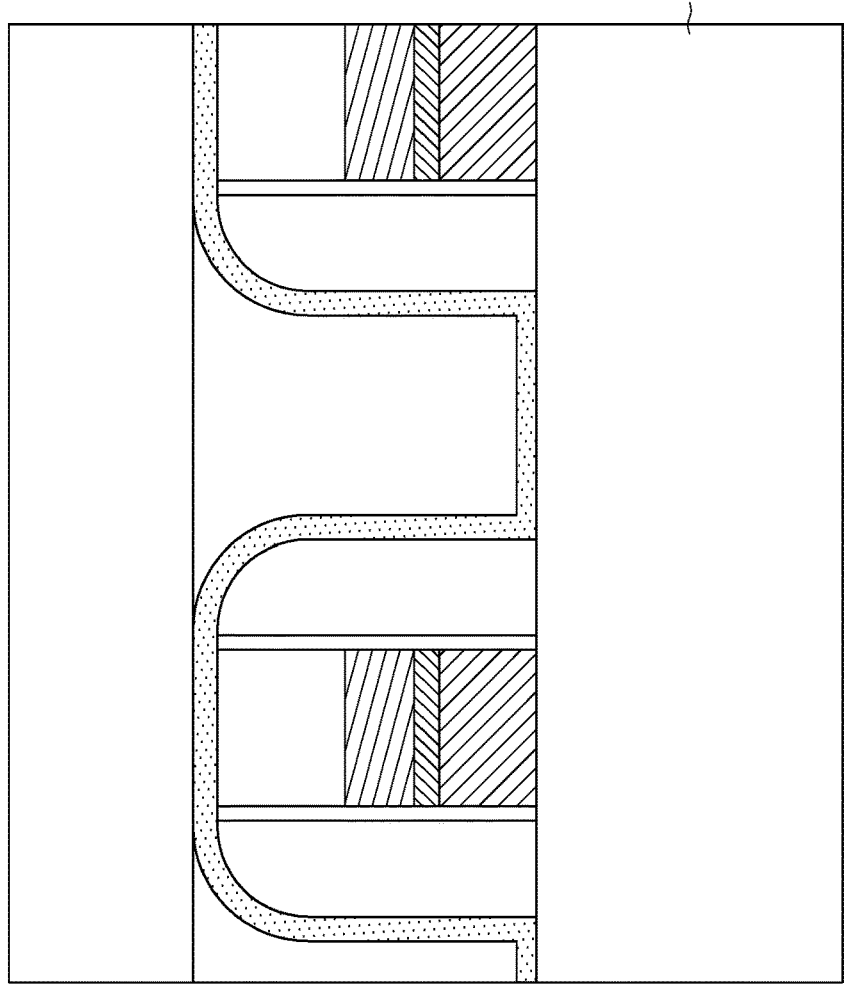
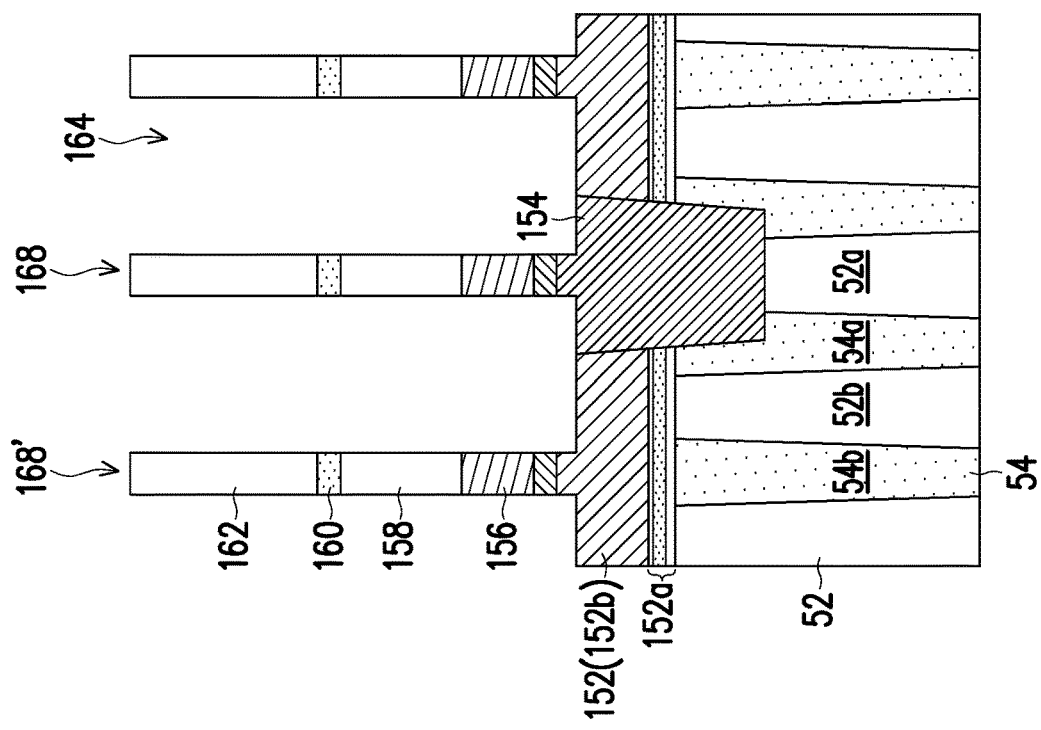
FIG. 6B

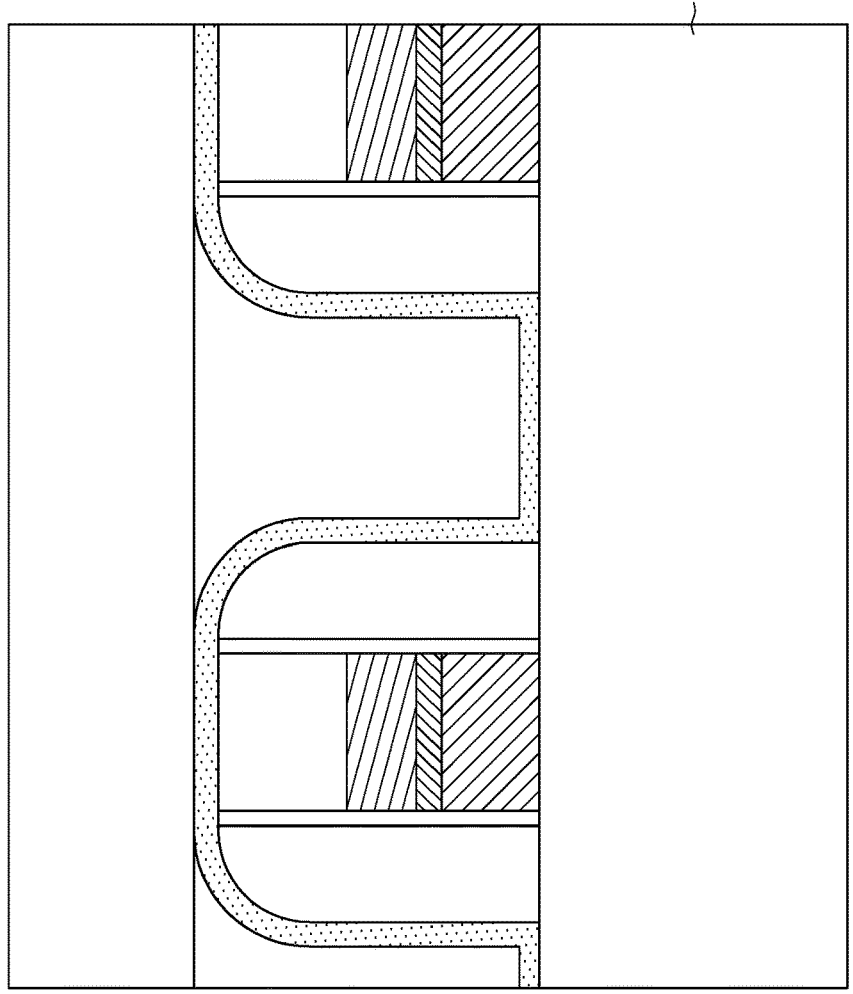
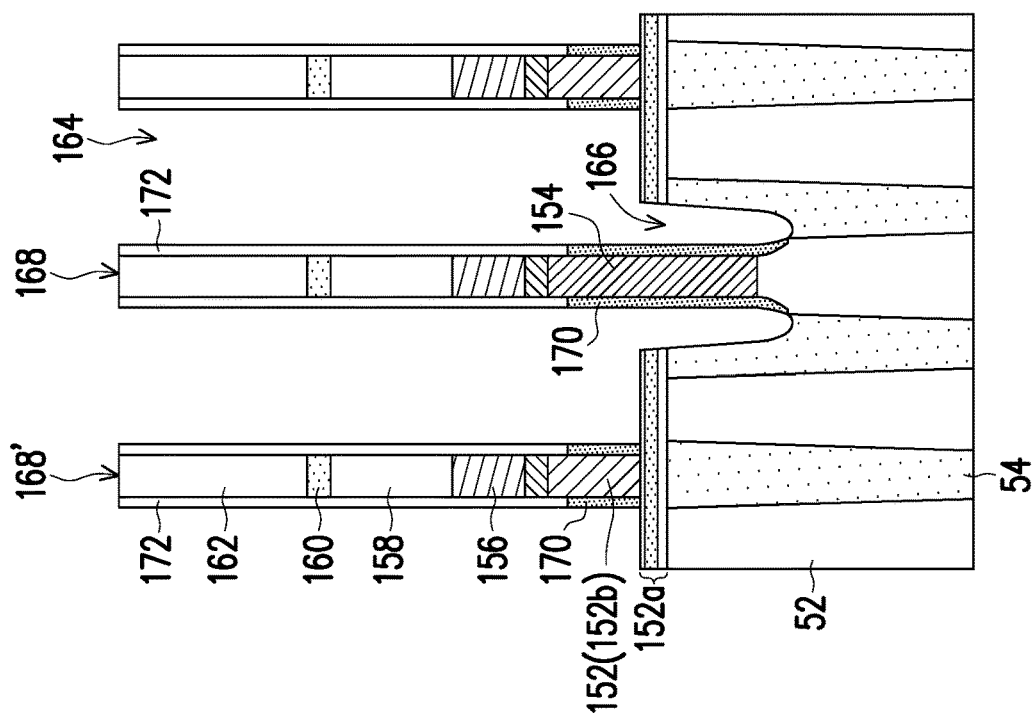
FIG. 6E

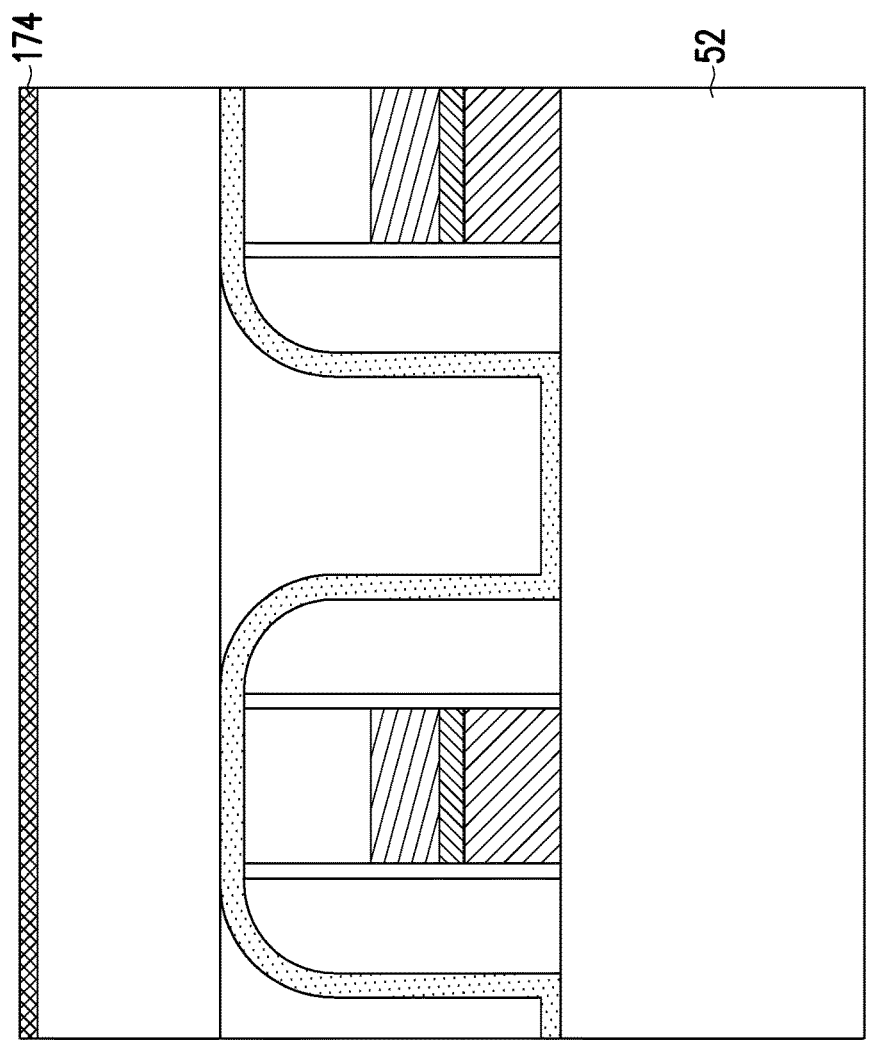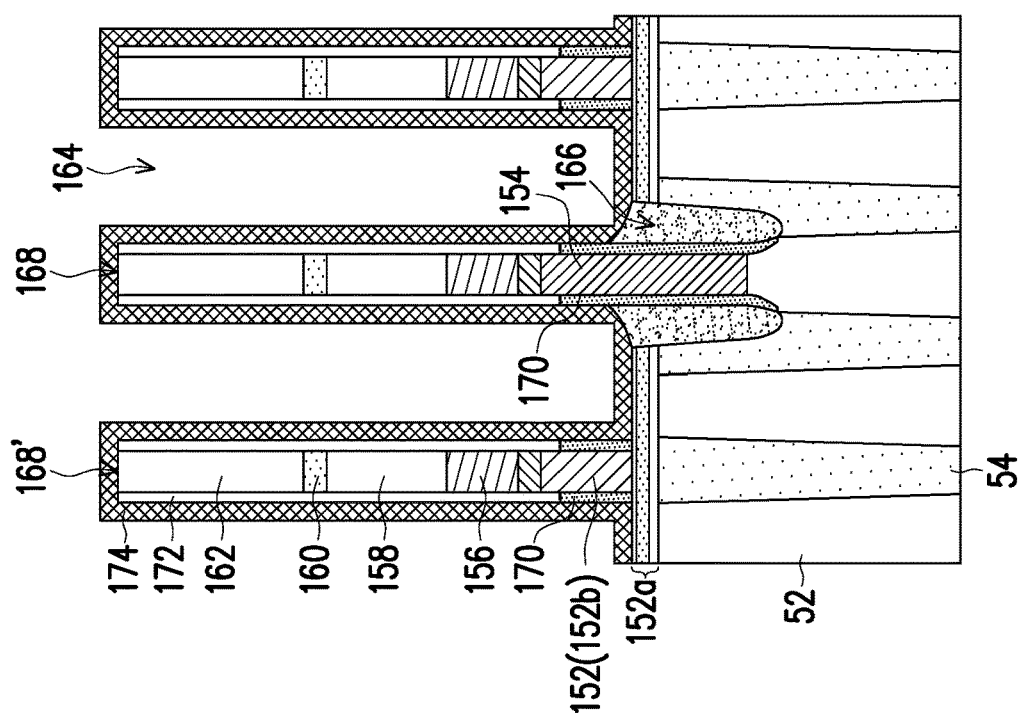
FIG. 6H

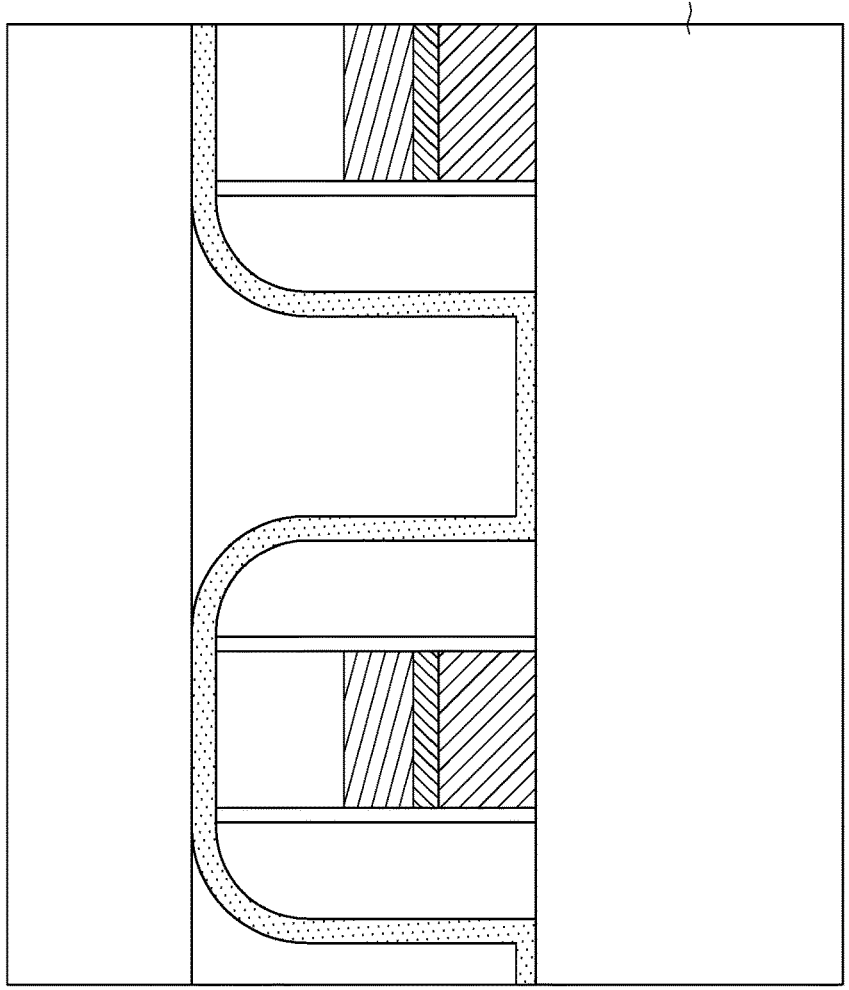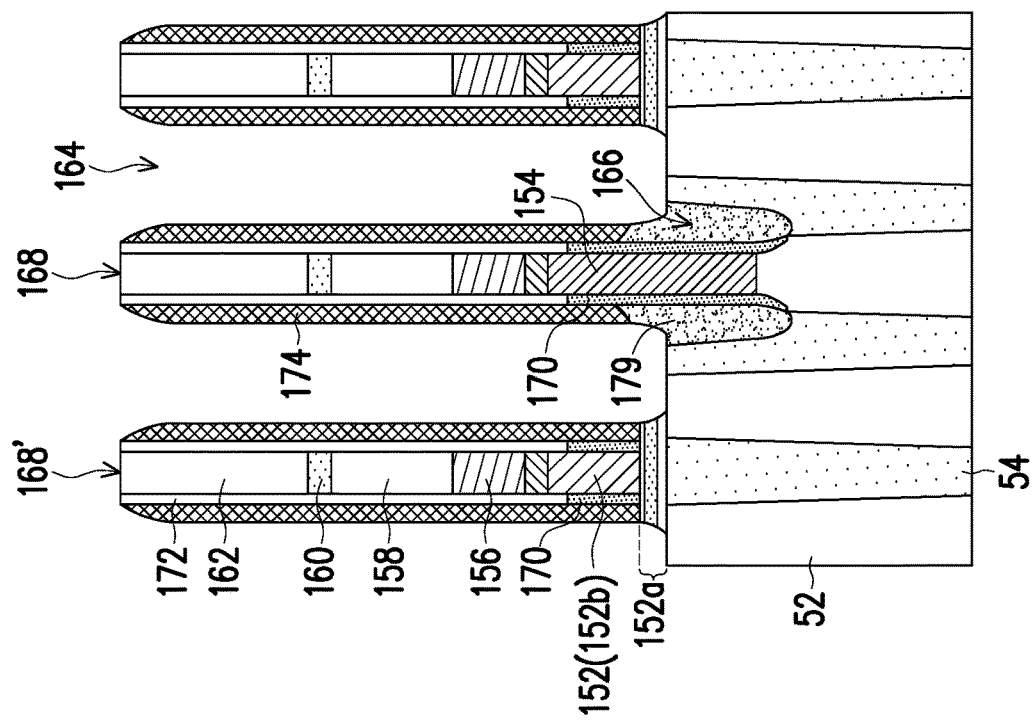
FIG. 6I

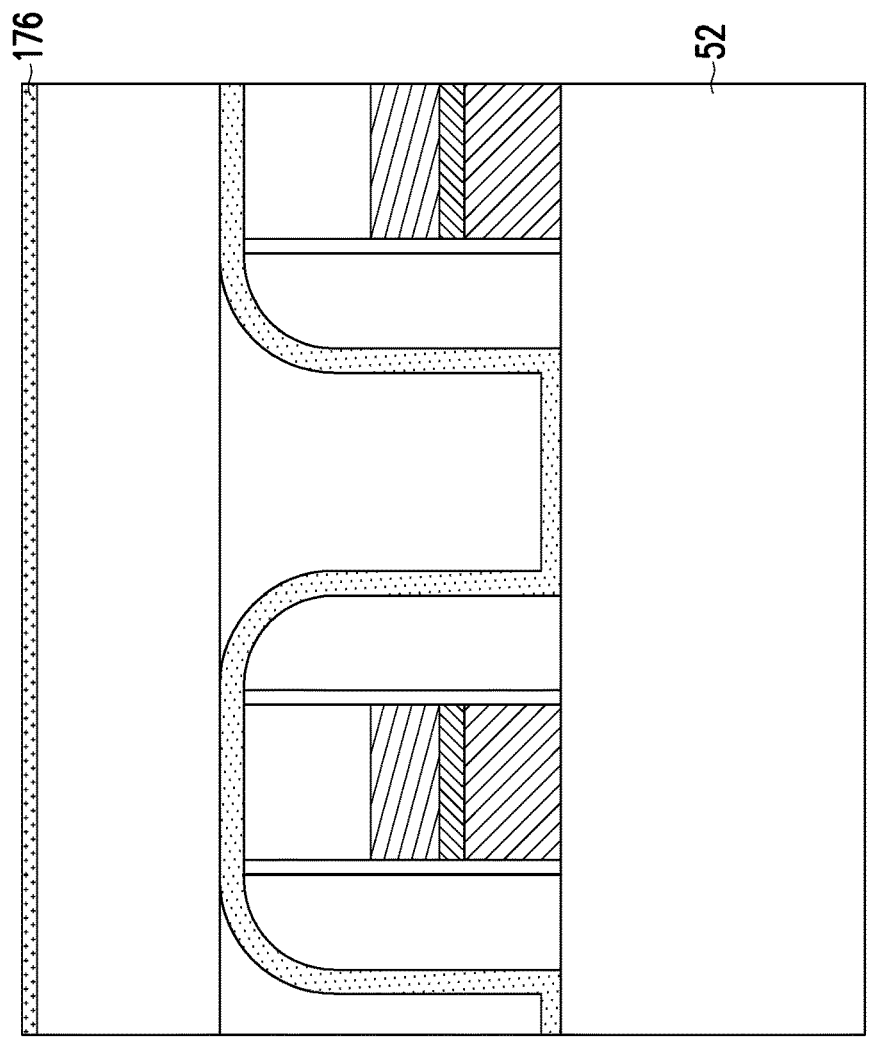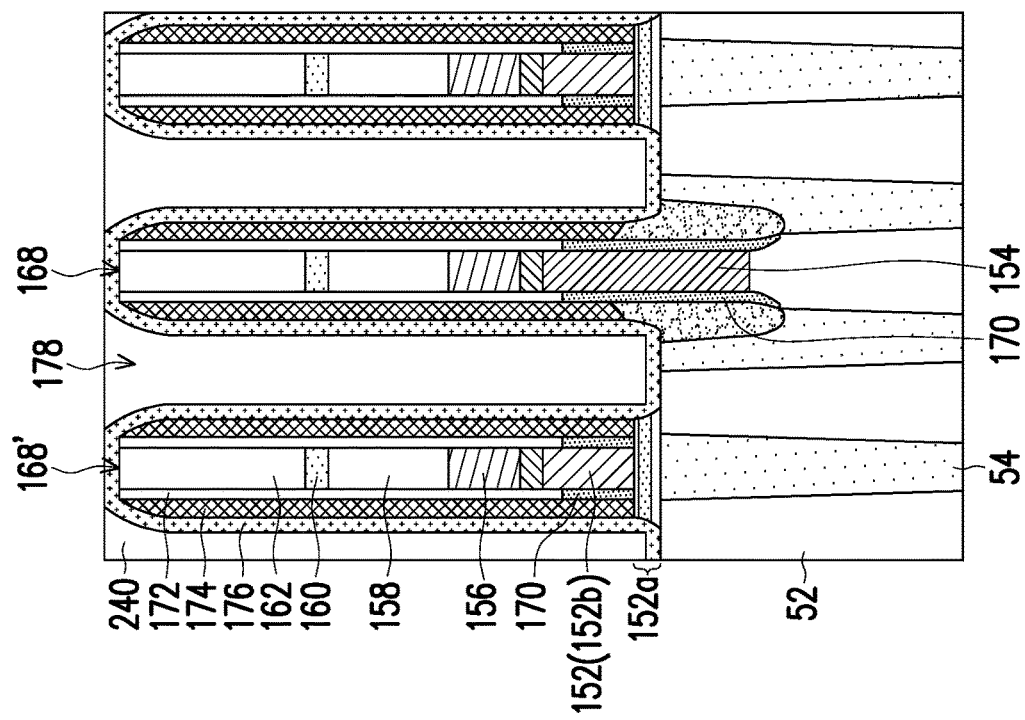
FIG. 6K

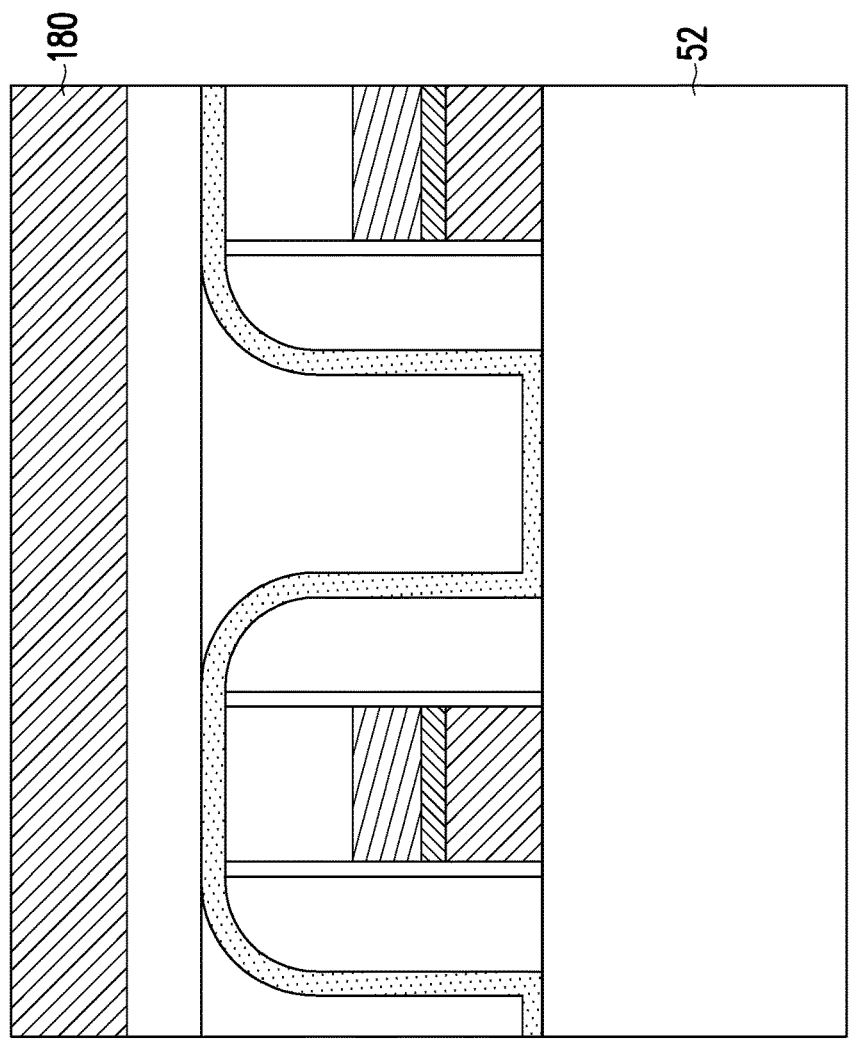
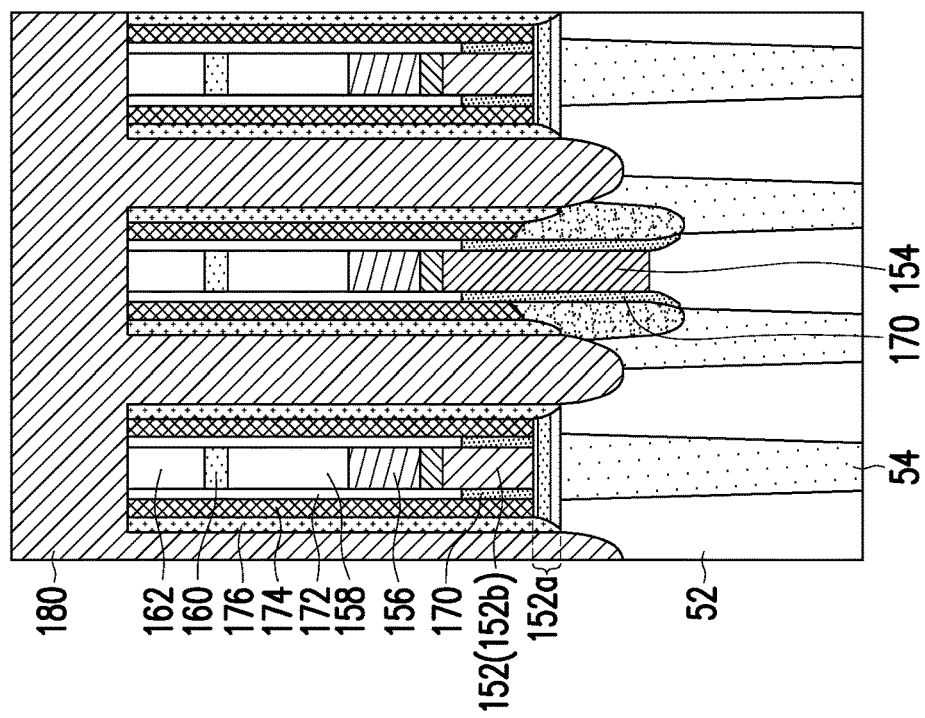
FIG. 6M

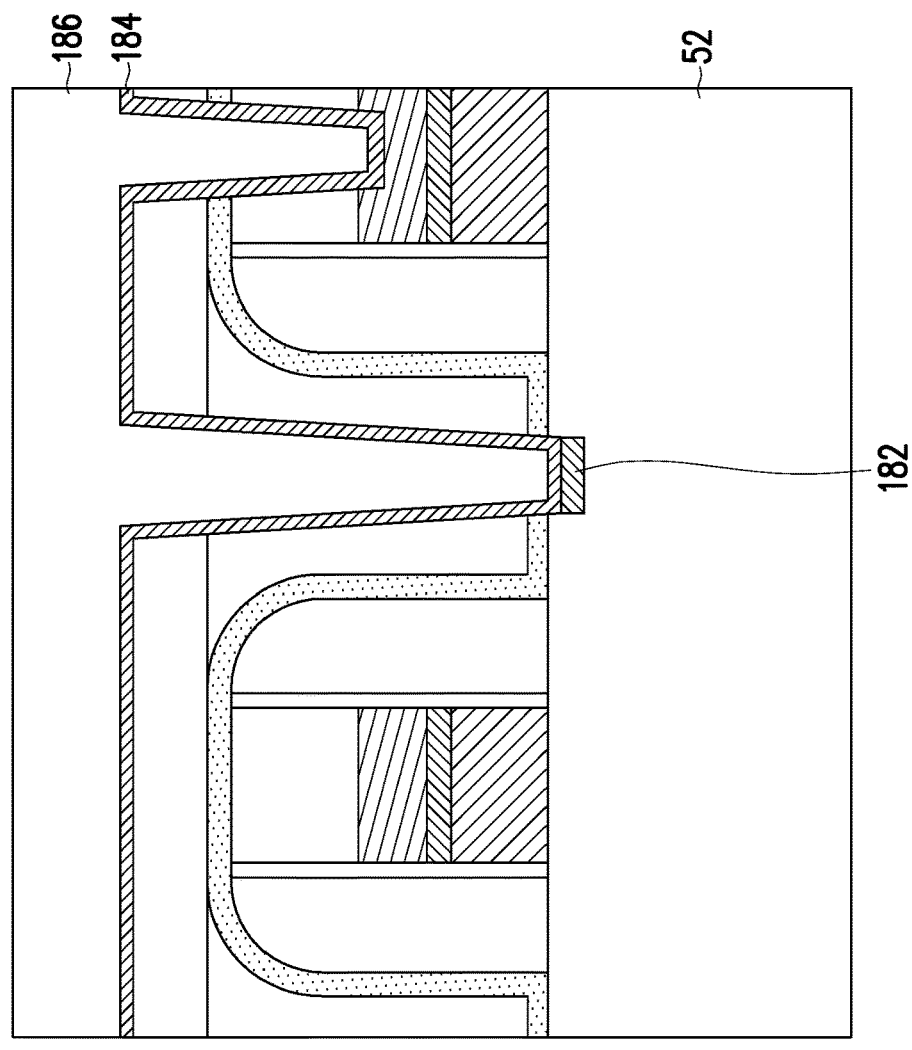
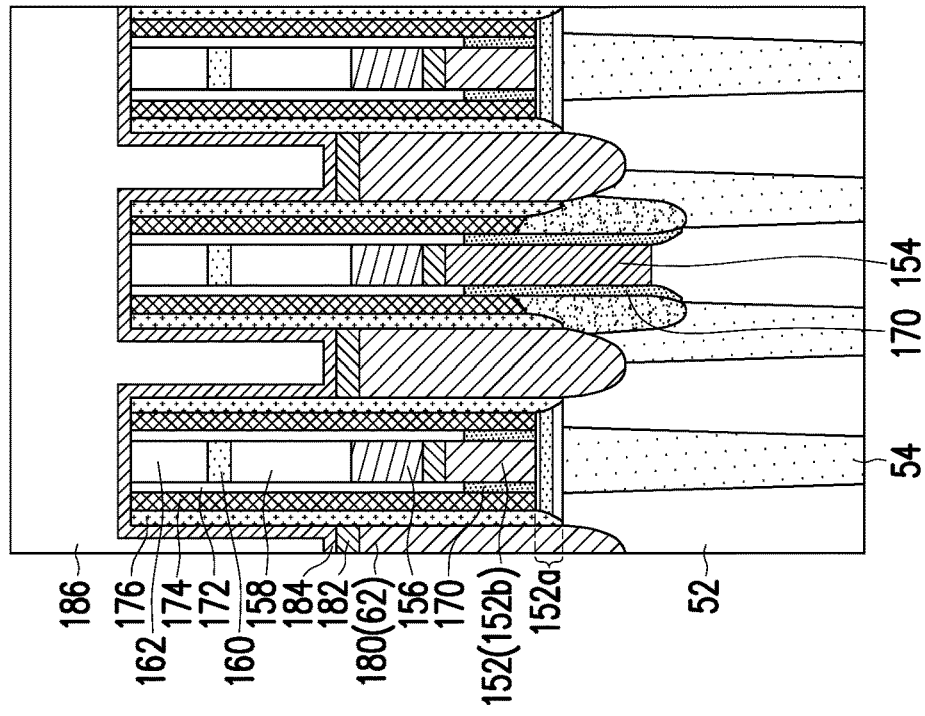
FIG. 60

STRUCTURE OF MEMORY DEVICE

BACKGROUND

1. Field of the Invention

The invention is related to semiconductor fabrication, and particularly related to the structure of memory device.

2. Description of Related Art

Cell structure of dynamic random access memory (DRAM) device is continuously developed to reduce cell size and improve the operation speed. A DRAM cell usually includes a transistor and a storage capacitor. The gate is connected to a word line, the drain/source is connected to the bit line and the source/drain is connected to the storage capacitor. The word line voltage on the word line may be used to turn on the transistor and the bit line voltage may provide charges to the source of the transistor. The charges are stored in the storage capacitor. To connect to the storage capacitor and the bit line, a bit line contact and a capacitor contact are used for the connection.

However, when the cell size is greatly reduced, the bit line parasitic capacitance may get more serious between these various contacts. The bit line parasitic capacitance would cause the signal delay and then reduce the operation speed, and especially induce less sensing margin.

How to reduce the bit line parasitic capacitance between these various contacts in DRAM cell is still under investigation and developing.

SUMMARY OF THE INVENTION

The invention provides a cell structure for memory cell, such as DRAM cell, in which the bit line parasitic capacitance between contacts may be reduced.

In an embodiment, a structure of memory cell includes a substrate. The substrate includes a first active region, a second active region and a first shallow trench isolation (STI) structure between the first active region and the second active region, wherein the first active region is lower than the second active region. A first contact structure is disposed on the first active region. A first stack structure is on the first contact structure. A second contact structure is on the substrate with a bottom portion in the substrate at an interface between the second active region and the first STI structure. A dielectric spacer is at least on a sidewall of the first contact structure. An insulating layer is disposed on the dielectric spacer and between the second contact structure and the first contact structure with the first stack structure, wherein a dielectric constant of the dielectric spacer is lower than a dielectric constant of the insulating layer.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 5A to FIG. 5L are drawings, schematically illustrating a process flow of a method to fabricate the memory cell as viewed by cross-section structure cutting at the line I-I in FIG. 2.

DESCRIPTION OF THE EMBODIMENTS

The invention is directed to a structure of memory cell, such as DRAM cell. In recent development, the DRAM cell utilizes polysilicon metal bit line structure or metal bit line structure to reduce the bit line resistance. Further, when the cell size is greatly reduced, the distance between conductive structure in the conduction route is accordingly reduced. The nitride dielectric material may be used at sidewall of the conductive structure to have sufficient isolation therebetween. However, the parasitic capacitance would get more serious.

In an example, the bit line contact may be quite close to the capacitor contact in the cell structure. To prevent a circuit short or leakage between the bit line contact and the capacitor contact, normally the bit line contact is covered by SiN layer. To reduce the parasitic capacitance, multiple sidewall layers, such as SiN/$SiO_2$/SiN, or SiN/Air gap/SiN) may be implemented for the bit line to reduce bit line parasitic capacitance, in which $SiO_2$ dielectric constant around 3.9 is lower than SiN dielectric constant around 7.0.

In the invention, a structure of the insulating dielectric layer at sidewall of the bit line contact and bit line polysilicon is proposed to at least reduce the bit line parasitic capacitance.

Several embodiments are provided to describe the invention but the invention is not just limited to the embodiments as provided. Further, a combination between the embodiments may still be made for further embodiments.

Figure 1:
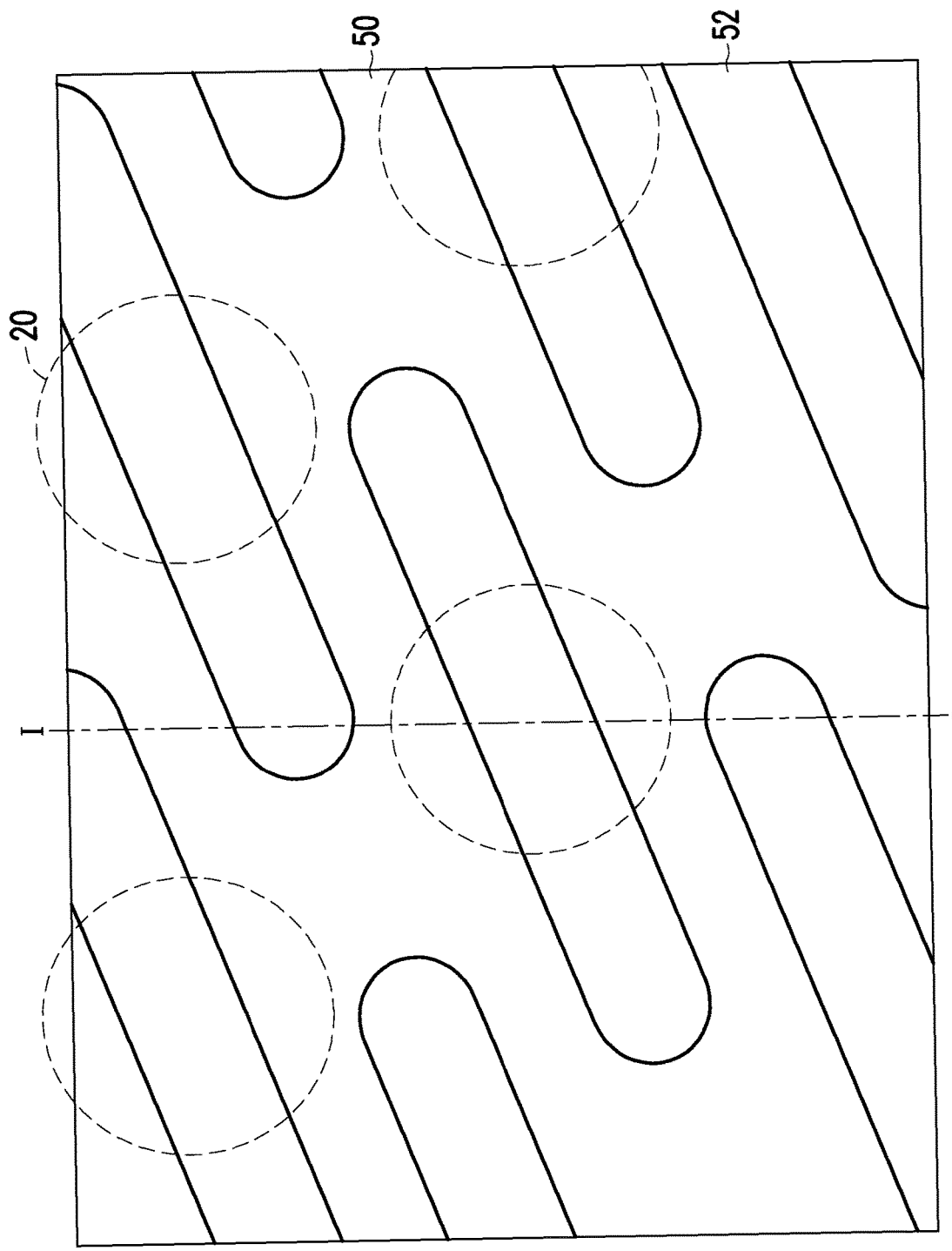
FIG. 1 is a drawing, schematically illustrating a layout of active region of memory cell in a substrate, according to an embodiment of the invention.

FIG. 1 is a drawing, schematically illustrating a layout of active region of memory cell in a substrate, according to an embodiment of the invention. Referring to FIG. 1, the active regions 52 are configured in the substrate 50. The active regions 52 are extending at a slant direction and shift between the two rows of active regions at the slant direction. In this layout, the cell regions 20 are preserved at the central part of the active region 52. The locations of the cell regions 52 are alternately shifted.

Figure 2:
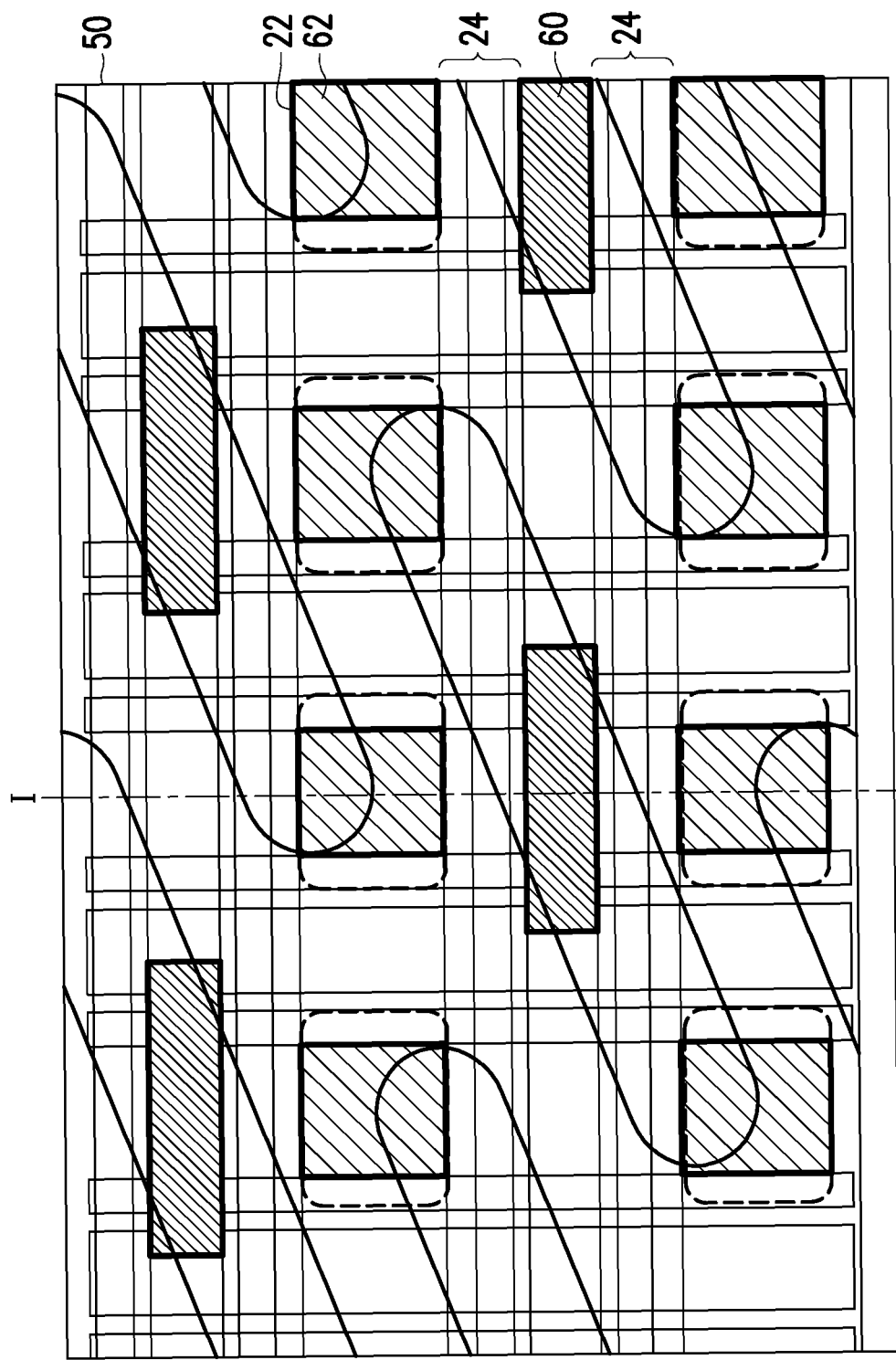
FIG. 2 is a drawing, schematically illustrating a layout of a partial structure of DRAM cell on the substrate in FIG. 1, according to an embodiment of the invention.

FIG. 2 is a drawing, schematically illustrating a layout of a partial structure of DRAM cell on the substrate in FIG. 1, according to an embodiment of the invention. Referring to FIG. 2, as shown in part, the bit line contact structure 60 is formed within the corresponding cell region 20. The capacitor contact structure 62 within the capacitor region 22 is also formed adjacent to the corresponding bit line contact structure 60, so as to electric coupled to a storage capacitor subsequently. The word line direction is extending along the line I-I, and the bit line is extending along a direction perpendicular to the line I-I. The insulating layer 24 is formed to at least isolate the bit line contact structure 60 and the capacitor contact structure 62, and also the bit line to capacitor contact 62.

As noted, the structure shown in FIG. 2 is just a part of the DRAM cell but relating to the invention. In addition, the bit line contact structure 60 may be generally referred as a first contact structure and the capacitor contact structure 62 may be generally referred as a second contact structure. Since the distance between the bit line contact structure 60 and the capacitor contact structure 62 is quite small, both the insolation and the parasitic capacitance between them would be considered together to have sufficient isolation capability and less parasitic capacitance.

Figure 3:
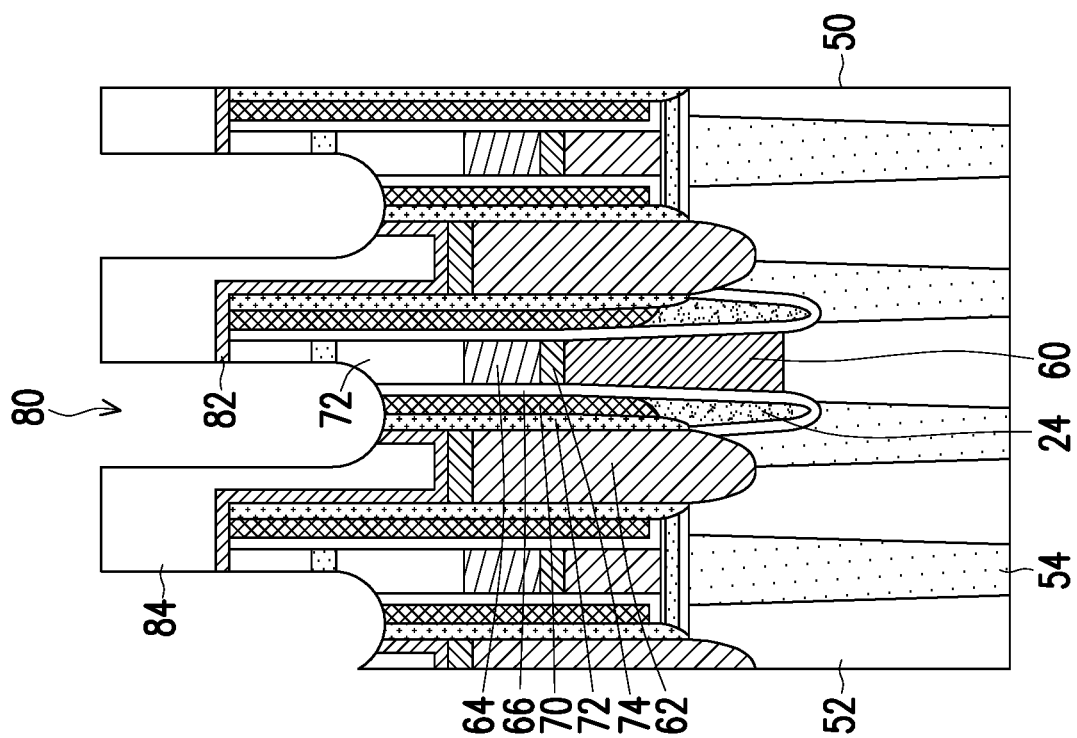
FIG. 3 is a drawing, schematically illustrating a structure of DRAM cell in cross-section view, according to an embodiment as investigated in the invention.

FIG. 3 is a drawing, schematically illustrating a structure of DRAM cell in cross-section view, according to an embodiment as investigated in the invention. Referring to FIG. 3 and FIG. 2, a structure seen at the cross-section view as cutting at the line I-I in FIG. 2 is looked into. The substrate 50 has the shallow trench isolation (STI) structures 54. The active regions 52 are formed in the substrate 50 between the STI structure 54. The bit line contact structure 60 is formed on the active region 52, which is lower than the adjacent active region 52. The active region 52 under the bit line contact structure 60 may be generally referred as a first active region while the active region 52 under the capacitor contact structure 62 may be generally referred as a second active region. The STI structure 54, as also referred as a first STI structure, is between the first active region 52 under the bit line contact structure 60 and the second active region 52 under the capacitor contact structure 62. The STI structure 54 adjacent to the first STI structure 54 may be generally referred as the second STI structure.

The capacitor contact structure 62 generally is disposed on the substrate 50 with a bottom portion in the substrate 50 at an interface between the second active region 52 and the STI structure 54. The insulating layer 24 in a stack structure of multiple dielectric layers 66, 70, 72 is between the capacitor contact structure 62 and the bit line contact structure 60 for general isolation. A conductive stack layer includes the barrier layer 74 and metal layer 64 is disposed on the bit line contact structure 60. The barrier layer 74 is TiN as an example. Then the metal layer 64 such as tungsten may be formed on the barrier layer 74 to have a stack layer. However, the invention is not limited to the stack layer as provided. The mask layer 72, such as SiN may be further stacked on the metal layer 64 as a part of the stack layer on the bit line contact structure 60. Further, another stack layer including various conductive layers including the TiN layer 82 as stacked may be formed on the capacitor contact structure 62. The interconnection layer 84 is subsequently formed over the structure capacitor contact structure 62. The structure in detail is to be described later. The cutting portion 80 is formed to separate the memory cell in connection to the other circuit element.

As looking into the structure in the FIG. 3, the insulating layer 24 between the capacitor contact structure 62 and the bit line contact structure 60 is at least concerned. The insulating layer 24 is dominated by nitride material for better isolation. However, the dielectric constant is higher than the oxide material. The parasitic capacitance may get more serious between the capacitor contact structure 62 and the bit line contact structure 60 because of the short distance between them. The structure of the insulating layer 24 needs to be considered to have both the isolation capability and the reduced parasitic capacitance.

Figure 4:
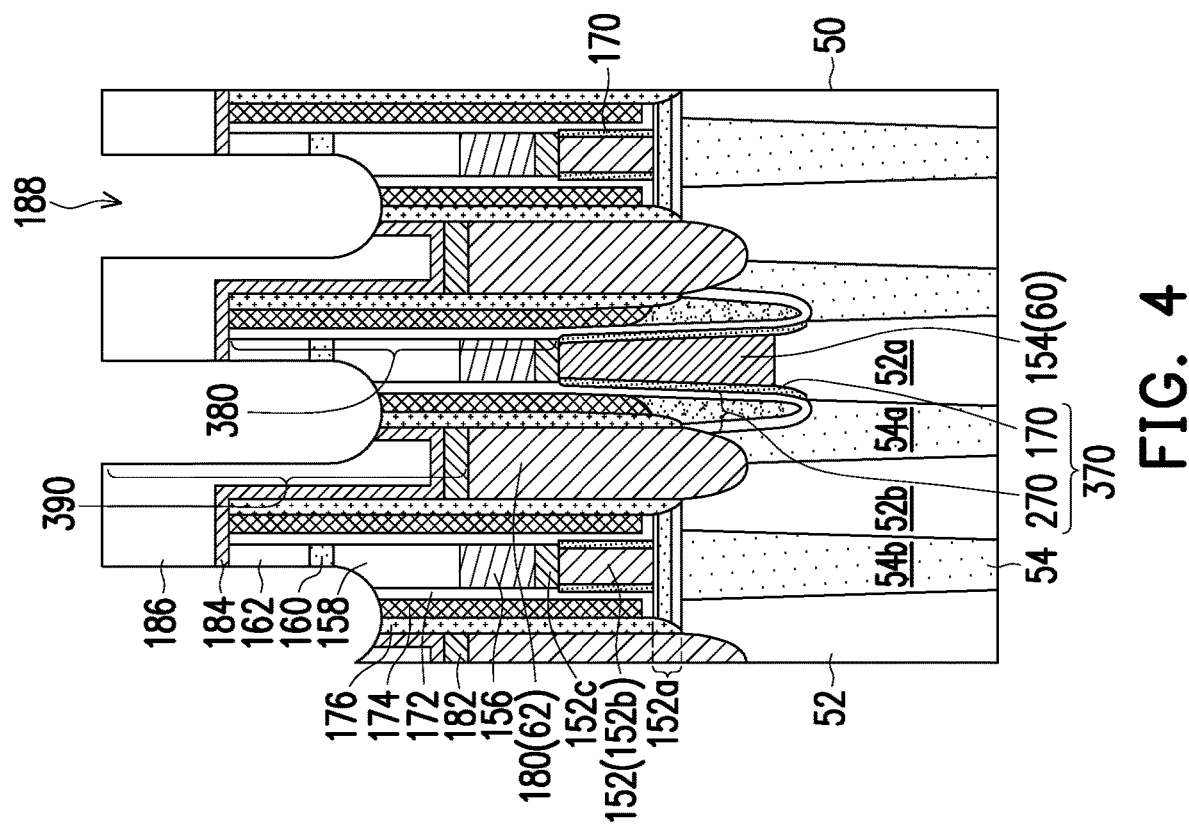
FIG. 4 is a drawing, schematically illustrating a structure of DRAM cell in cross-section view, according to an embodiment of the invention.

FIG. 4 is a drawing, schematically illustrating a structure of DRAM cell in cross-section view, according to an embodiment of the invention. Referring to FIG. 4, in an embodiment, the structure of DRAM cell is modified from the structure in FIG. 3 as looked into.

The active regions 52 and the STI structure 54 in the substrate 50 are same to FIG. 1 to FIG. 3. One memory cell is taken as an example for description. In this memory cell, the first active region 54a and the second active region 54b are taken for easy description. Further the first STI structure 54a and the second STI structure 54b are also taken for easy description. A bit line contact structure 154 (60 in FIG. 3) is disposed on the first active region 52a. A first stack layer 380 is disposed on the first active region 52a. A second stack layer 390 is disposed on the capacitor contact structure 180 (62). Another bit line stack 152 may also disposed over the second STI structure 54b. The bit line stack 152 in an embodiment may include a polysilicon layer 152b. In addition, an insulating bottom 152a may be disposed under the bit line stack 152. The TiN 152c may be further included to server as a barrier layer to form the metal layer 156, such as tungsten.

The insulating stack layer 370 is at least at least between the bit line contact structure 154 and the capacitor contact structure 180 for isolation at least between them. The insulating stack layer 370 in an embodiment may include a dielectric spacer 170 and an insulating layer 270. The dielectric spacer 170 such as oxide in an embodiment is at least disposed on the sidewall of the bit line contact structure 154, besides disposed on the sidewall of bit line poly 152b. The insulating layer 270 is dominated by silicon nitride and is composed of various layers as stacked, so as to have sufficient isolation capability. However, the dielectric constant of the dielectric spacer 170 is less than the dielectric constant from the insulating layer 270. As a result, the parasitic capacitance for the bit line contact structure 154 and bit line stack 152 is reduced.

The stack layer 380 may include various conductive layers, in an example, including TiN layer 152c, metal layer 156, dielectric layers 158, 169, 162 as a stack. However, the structure of the stack layer 380 is depending on the actual design without be limited to the embodiments. The stack layer 390 in an example includes the CoSi$_x$ layer 182, TiN layer 184 and the interconnect layer 186 as stacked. However, the structure of the stack layer 390 is depending on the actual design without be limited to the embodiments. The insulating layer 270 has a vertical portion at top part between the bit line contact structure 154 and the capacitor contact structure 180, in an embodiment, may include multiple dielectric layers as indicated by 172, 174, 176 but the invention is not limited to.

It can be noted in later descriptions, in various embodiments under the aspect of the invention, the bottom portion of the insulating layer 270 may include a nitride liner layer in double stack or just a single nitride layer. The dielectric spacer 170 may be the oxide or air gap.

To fabricate the structure in FIG. 4, a fabrication process flow is further provided. FIG. 5A to FIG. 5L are drawings, schematically illustrating a process flow of a method to fabricate the memory cell as viewed by cross-section structure cutting at the line I-I in FIG. 2, according to an embodiment of the invention.

Figure 5A:
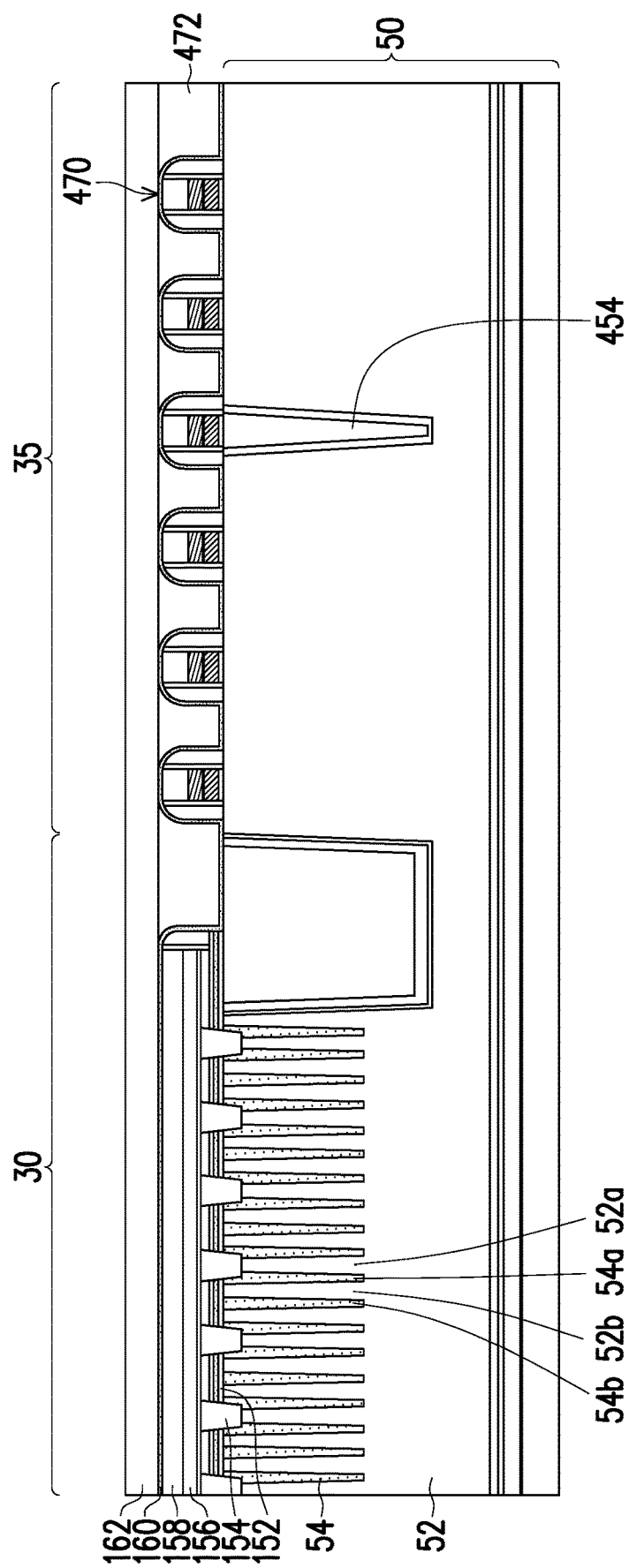

Referring to FIG. 5A, the substrate 50 may include an active region 52. The substrate is also configured to have a cell array region 30 and the peripheral region 35, which are separated by larger STI structure. The peripheral region 35 may include transistors 470, the STI structure 454 and inter-layer dielectric layer 472. The invention is not limited to the specific structure at the peripheral region 35.

In the cell array region 30 of the substrate 50, the STI structure 54 are formed in the substrate 50 to define active region 52 between the STI structure 54. Taking one cell for descriptions in accordance with the previous description of the structure, the bit line contact structure 154 in preliminary structure is formed on the first active region 52a. A bit line stack 152 in a preliminary stack is formed on the substrate 50. A metal layer 156 such as tungsten layer, is formed on the bit line stack 152. Dielectric layers 158, 160, 162 as a stack to serve as a mask are formed over the metal layer 156.

Referring to FIG. 5B, a patterning process with a is performed at the cell array region 30 to form an opening 164, while the bit line contact structure 154 and the bit line stack 168/168' is formed. As viewed in the cross-section structure after patterning process, the bit line stack 168 with a width, such as bit line width, remains on the first active region 52a and another bit line stack 168' with the same width is above the second STI structure 54b. A trench 166 is formed at sidewall of the bit line contact structure 154, extending into the substrate 50 at the interface of the first STI structure 54a and the first active region 52a. The material of the bit line contact structure 154 in an example is polysilicon with phosphorous doping.

Referring to FIG. 5C, an oxidation process is performed to form an oxide spacer as indicated by 170 on the sidewall bit line contact structure 154, active region 52 and the sidewall of polysilicon layer 152b in the bit line stack 168' Generally, the oxide spacer is referred as the dielectric spacer 170.

Referring to FIG. 5D, a nitride liner layer 172 is formed on over the substrate. As noted, conformal to the topologic surface at top. As noted, a portion 172' of the nitride liner layer 172 is still covering on the dielectric spacer 170 but thinner.

Referring to FIG. 5E, another preliminary nitride layer 179 is formed on the nitride liner layer 172. This nitride layer 179 also fills the trench 166 as formed previously.

Referring to FIG. 5F, an etching back process or wet etching such as $H_3PO_4$ in examples is performed to remove the top portion of the nitride layer 179 while the nitride liner layer 172 still remains. The remaining portion of the nitride layer 179 also still fills into the trench 166. As a result, the nitride layer 179 with the nitride liner layer 172 as a double-layer stack in an example fills the trench 166 at the sidewall of the bit line contact structure 154.

Referring to FIG. 5G, a dielectric layer 174, such as an oxide spacer, is further formed on the nitride liner layer 172 at the sidewall of the stack portion 168, 168' above the nitride layer 179.

Referring to FIG. 5H, a dielectric layer 176, such as a nitride spacer, is further formed on the dielectric layer 174. The nitride liner layer 172, the dielectric layer 174 and the dielectric layer 176 together as a stack structure may serve as a part of the insulating layer 270 to isolate the bit line contact structure 154 and the stack layer 380 on the bit line contact structure 154, as also referring to FIG. 4. The opening 164 in this stage is changed to the opening 178. The opening 178 as to be described in subsequent processes is for forming a capacitor contact structure 180 later.

Figure 5I:
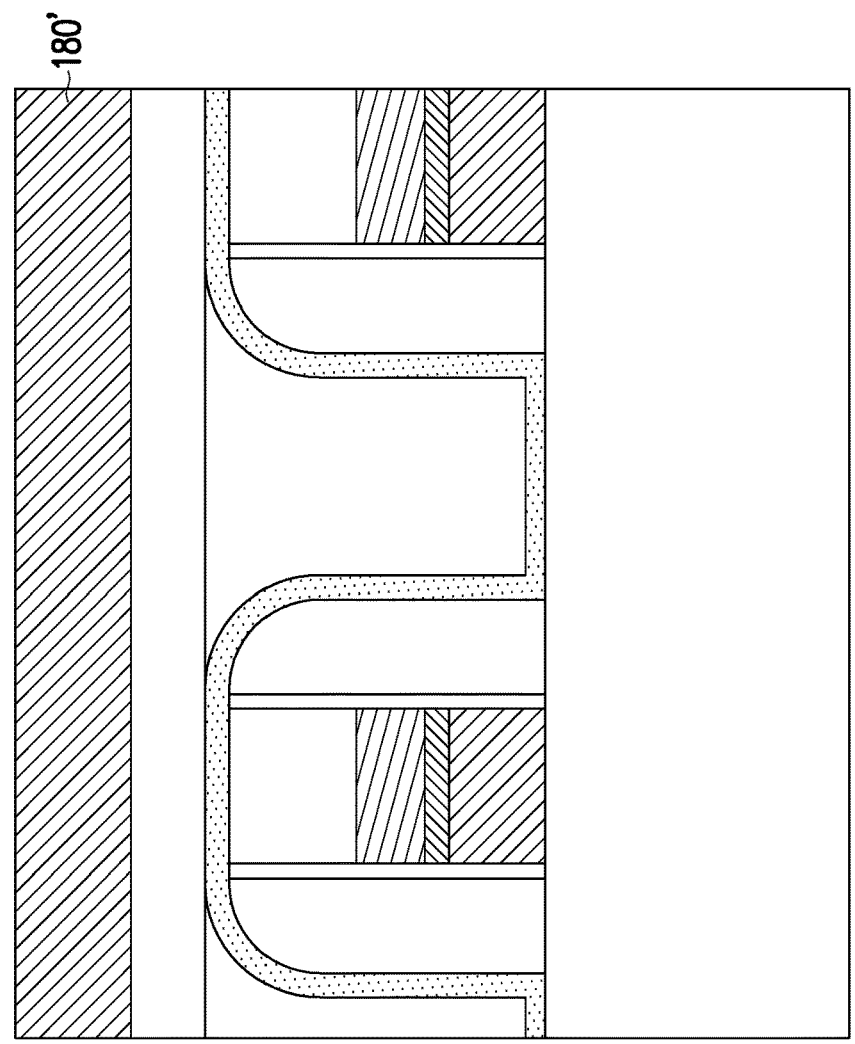

Referring to FIG. 5I, a preliminary polysilicon with phosphorous doping layer 180' is formed over the substrate to fill the opening 178 in FIG. 5H.

Referring to FIG. 5J, an etching back process in an example is performed to remove a top portion of the preliminary poly silicon layer 180'. The remaining portion of the preliminary polysilicon layer 180' is serving as the capacitor contact structure 180. The capacitor contact structure 180 is disposed on the substrate 50 at the interface between the first active region 52a and the first STI structure 54a. The insulation between the capacitor contact structure 180 and the bit line contact structure 154 is dominated by nitride but the dielectric spacer 170 as the oxide in an embodiment is also included to reduce the parasitic capacitance for the bit line contact structure 154, and the insulation between the capacitor contact structure 180 and bit line 168' is dominated by 172(SiN)/174(SiO2)/176(SiN) but the dielectric spacer 170 as the oxide in an embodiment is also included to reduce the bit line parasitic capacitance.

Referring to FIG. 5K, the subsequent process is to form the inter connection. A $CoSi_x$ layer 182 in an embodiment may be formed on the capacitor contact structure 180. A barrier layer 184, such as TiN layer, is conformally formed over the top surface of the substrate 50. A metal layer 186 is formed on the barrier layer 184, in which the metal layer 186 fills the space above the capacitor contact structure 180. In this structure, the metal layer 186 is electrically connected to the capacitor contact structure 180.

Figure 5L:
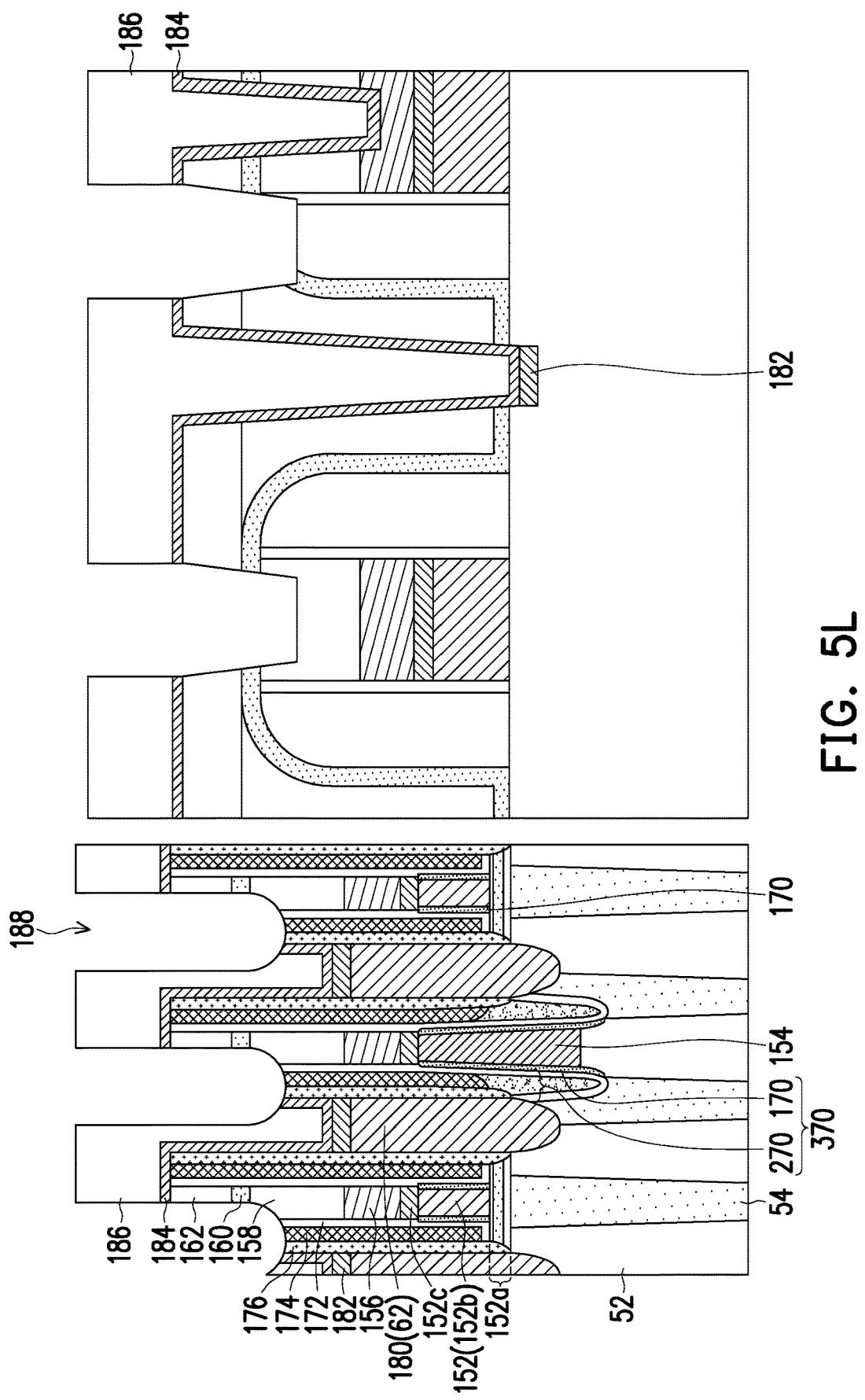

Referring to FIG. 5L, the barrier layer 184 and the metal layer 186 are patterned to have the cutting portion 188 and then individually connected to the capacitor contact structure 180 with the isolation from the insulating layer 270 of the insulating stack layer 370.

As also noted, some fabrication processes are commonly performed to the cell array region 30 and the peripheral region 35 without specifically described. The invention does not limit the structure in the peripheral region 35. The metal layer 186 in an embodiment is a part of interconnection structure.

In an embodiment, the invention may not limit to the stack structure above the bit line contact structure 154 and the capacitor contact structure 180. The invention may not limit to the stack of the insulating layer 270. In an embodiment, the invention introduces the dielectric layer 170 with less dielectric constant than the dielectric constant from the insulating layer 270. The parasitic capacitance for the bit line may be reduced.

As also noted, the bit line stack 152 may also formed over the second STI structure 54b with the dielectric spacer 170 at the sidewall. The polysilicon layer 152b is actually used as bit line in an embodiment.

Figure 6A:
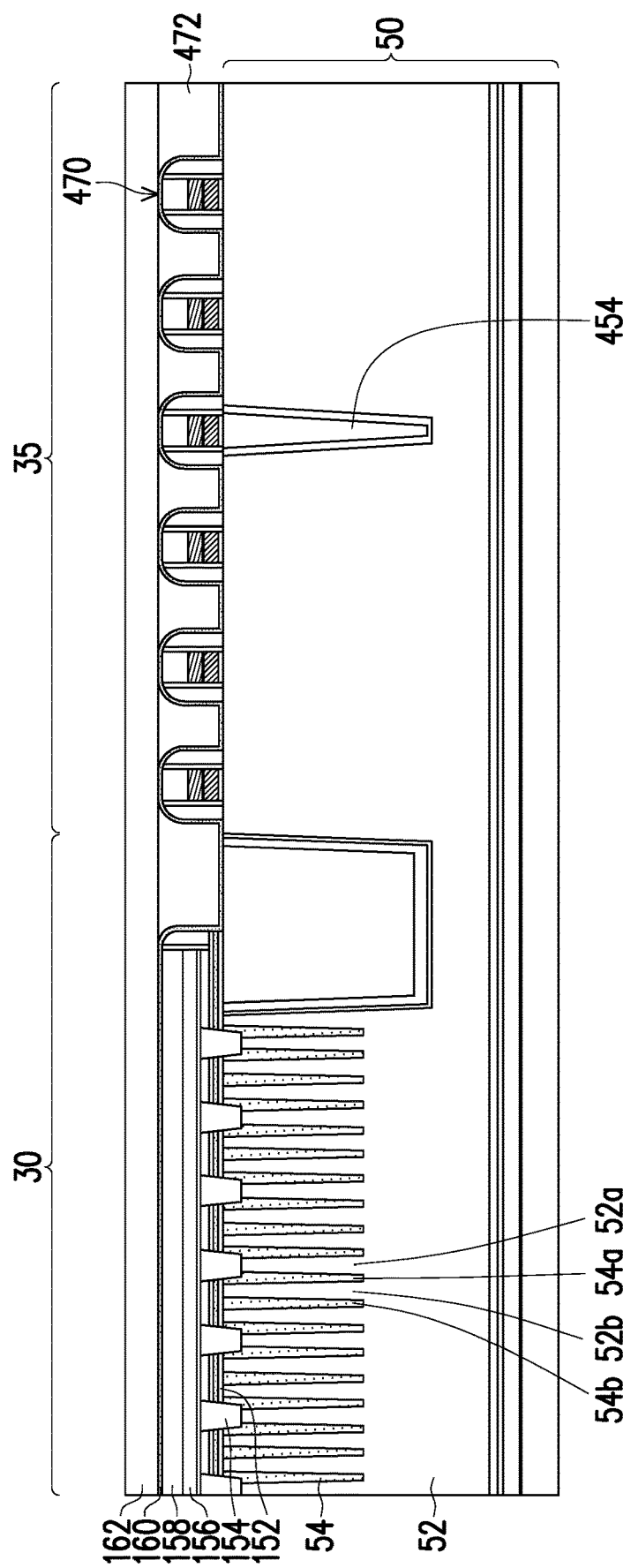
FIG. 6A to FIG. 6P are drawings, schematically illustrating a process flow of a method to fabricate the memory cell as viewed by cross-section structure cutting at the line I-I in FIG. 2.

In further embodiments, the insulating layer 270 may be formed by a single nitride without nitride liner. FIG. 6A to FIG. 6P are drawings, schematically illustrating a process flow of a method to fabricate the memory cell as viewed by cross-section structure cutting at the line I-I in FIG. 2.

Referring to FIG. 6A, it is the same as the structure in FIG. 5A. The description of FIG. 6A may refer to FIG. 5A.

Referring to FIG. 6B, a patterning process is performed to form the portion 168 above the bit line contact structure 154 and the portion 168' above the STI structure 54b. Different from FIG. 5B, the patterning process stops on the bit line contact structure 154, which substantially remains at current stage. In other words, the bit line stack 152b and the bit line contact structure 154 are not substantially etched.

Figure 6C:
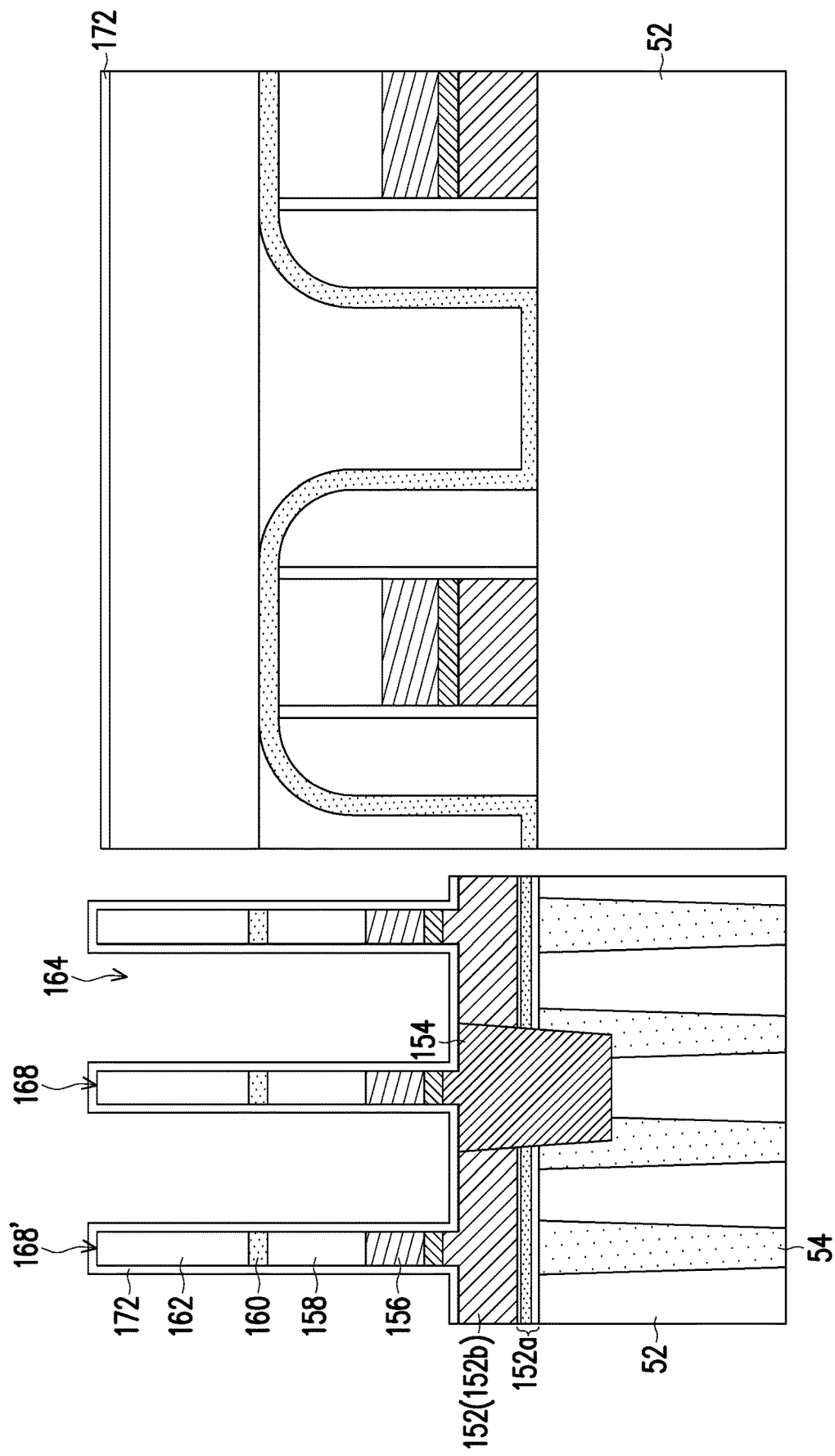

Referring to FIG. 6C, a nitride liner layer 172 is conformally formed over the top surface of the substrate 50.

Figure 6D:
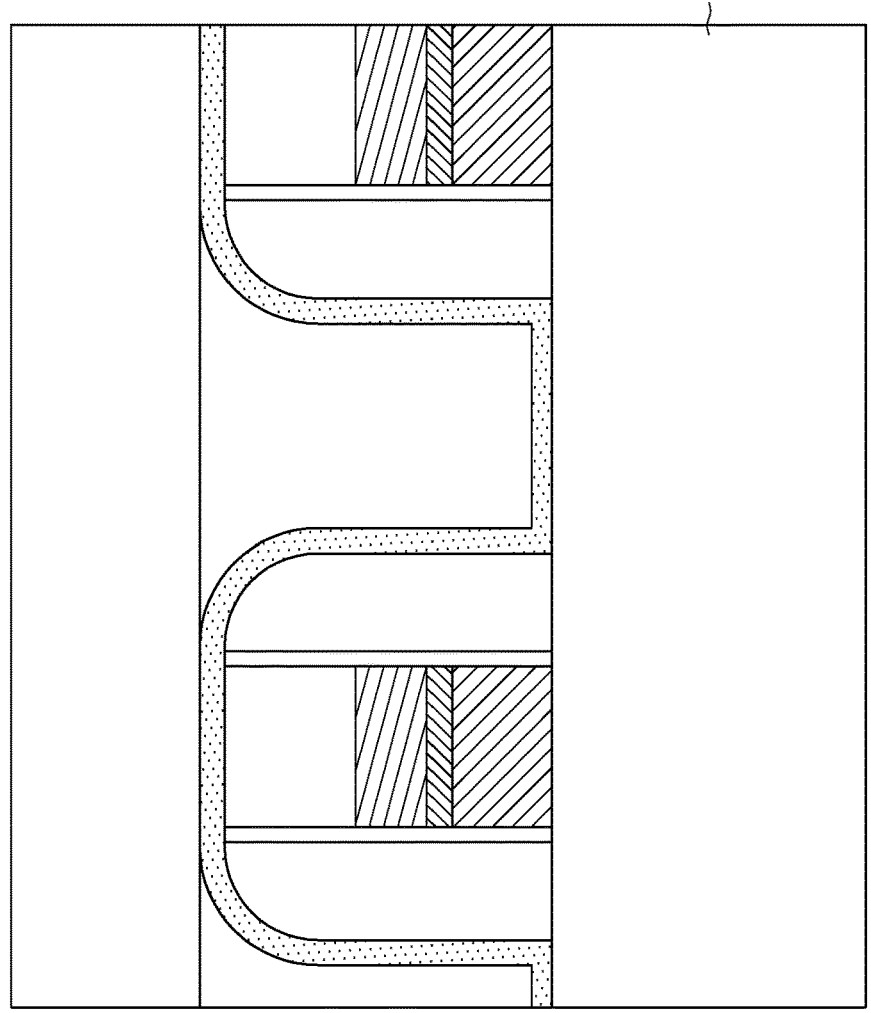

Referring to FIG. 6D, in an embodiment, an etching process is performed to form the nitride liner layer 172, serving as nitride spacer, on the sidewall of the portion 168 and the portion 168' but substantially not on the sidewall of the bit line contact structure 154, and not on the sidewall of bit line part 152*b*, in the embodiment. Further, the trench 166 similar to FIG. 5B is also formed. In this stage, as noted, the sidewall of the bit line contact structure 154 is exposed not covered by the nitride liner layer 172. Bit line part 152*b* is also Referring to FIG. 6E, an oxidation process in an example is performed on the sidewall of the bit line contact structure 154 and bit line stack 152*b* to form the dielectric spacer 170, such as oxide spacer in an embodiment.

Figure 6F:
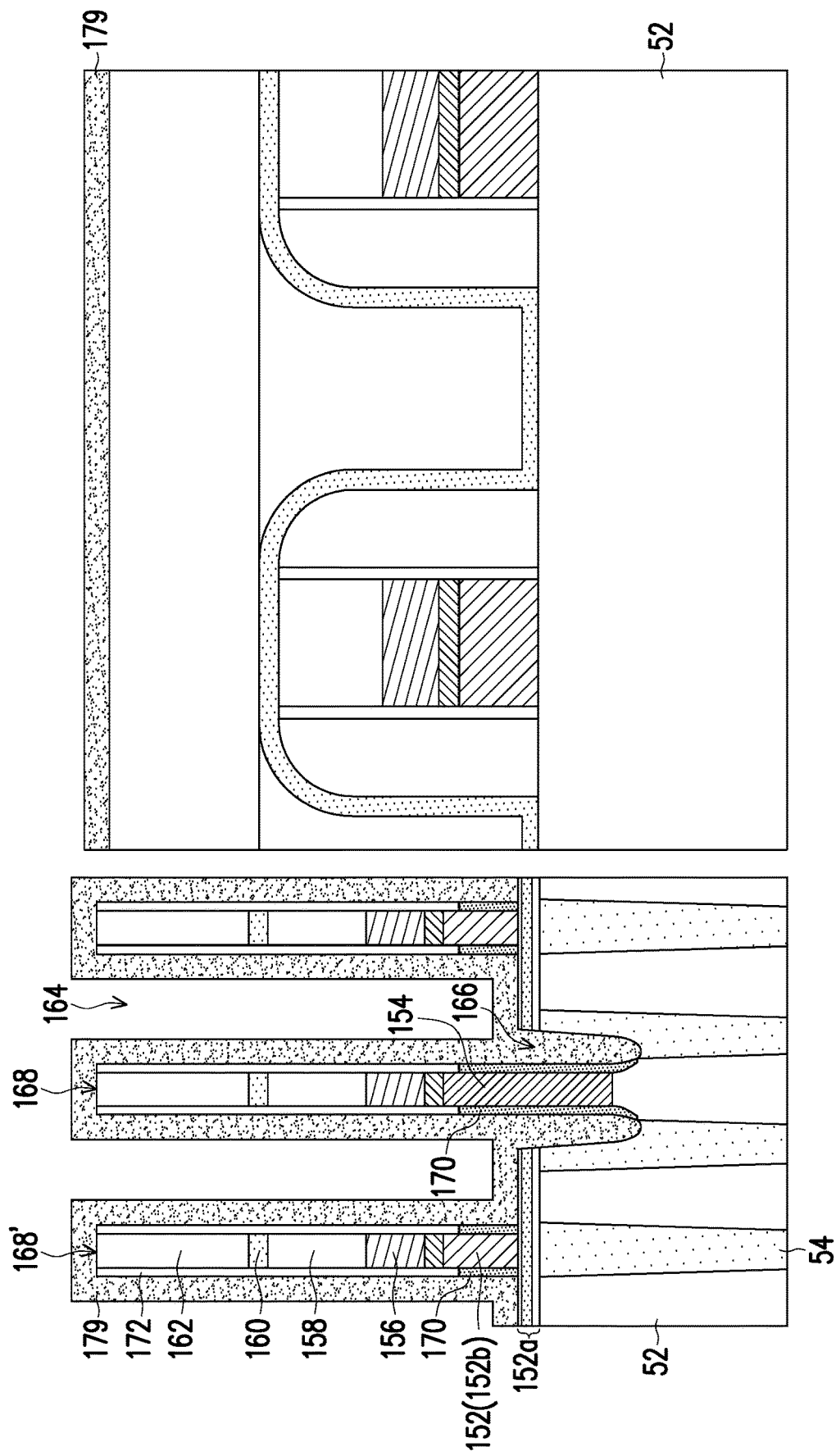

Referring to FIG. 6F, similar to FIG. 5E, a preliminary nitride layer 179 is formed on over the topological surface of the substrate, at least covering the nitride liner layer 172. This nitride layer 179 also fills the trench 166 as formed previously.

Figure 6G:
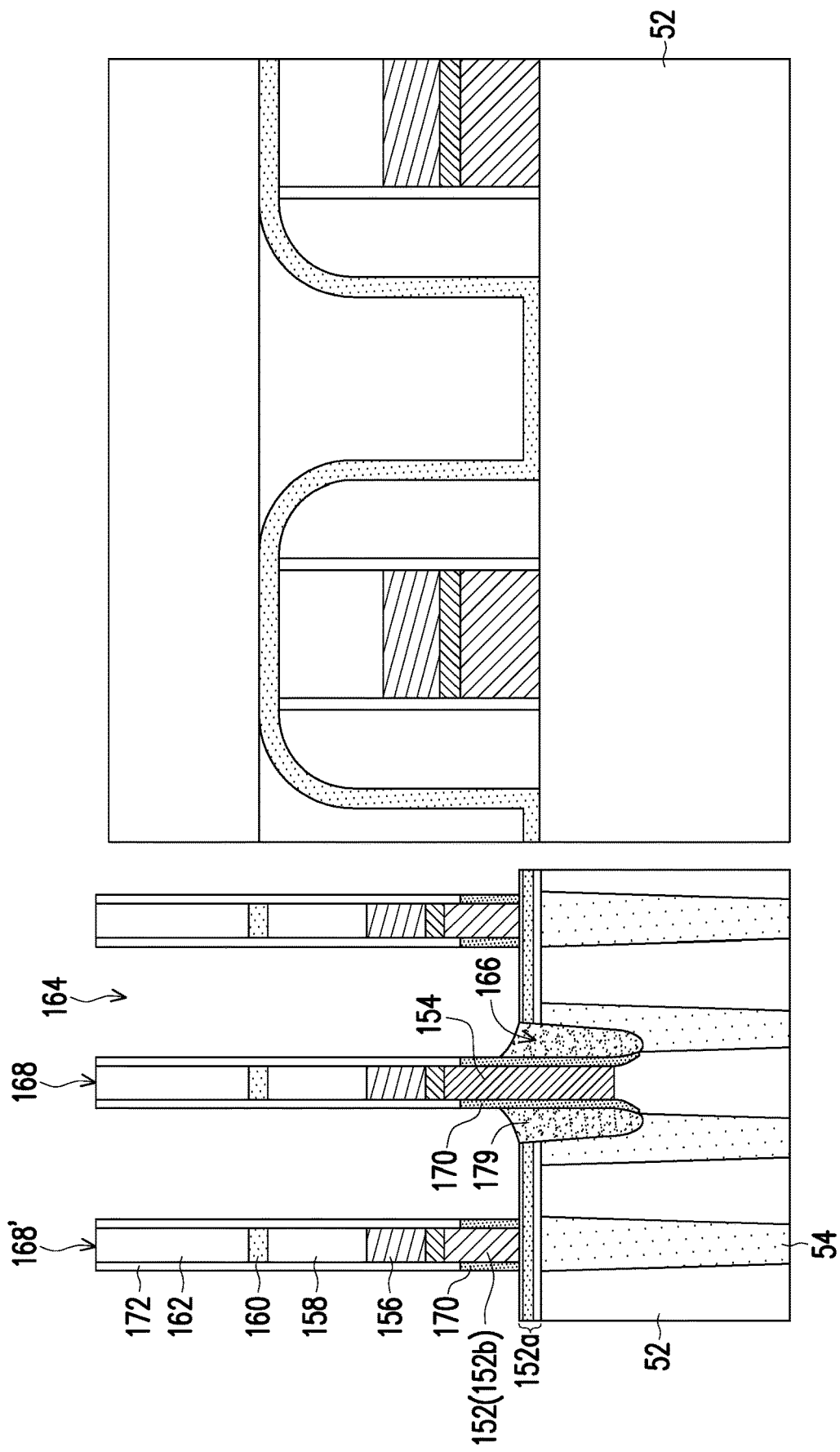

Referring to FIG. 6G, the top portion of the nitride layer 179 is removed by performing wet etching with $H_3PO_4$. As a result, the remaining portion of the nitride layer 179 remains and fills the trench 166. In the embodiment, the nitride layer 179 is a single layer without stack with the nitride liner layer 172 when comparing to FIG. 5F.

Referring to FIG. 6H, a dielectric layer 174, such as an oxide layer, is further over the topological surface of the substrate, at least covering on the nitride liner layer 172 at the sidewall of the stack portion 168, 168'.

Referring to FIG. 6I, an etching back process in an example is performed to etch the dielectric layer 174. As a result, the remaining portion of the dielectric layer 174 is a dielectric spacer on the nitride liner layer 172 and above the nitride layer 179.

Figure 6J:
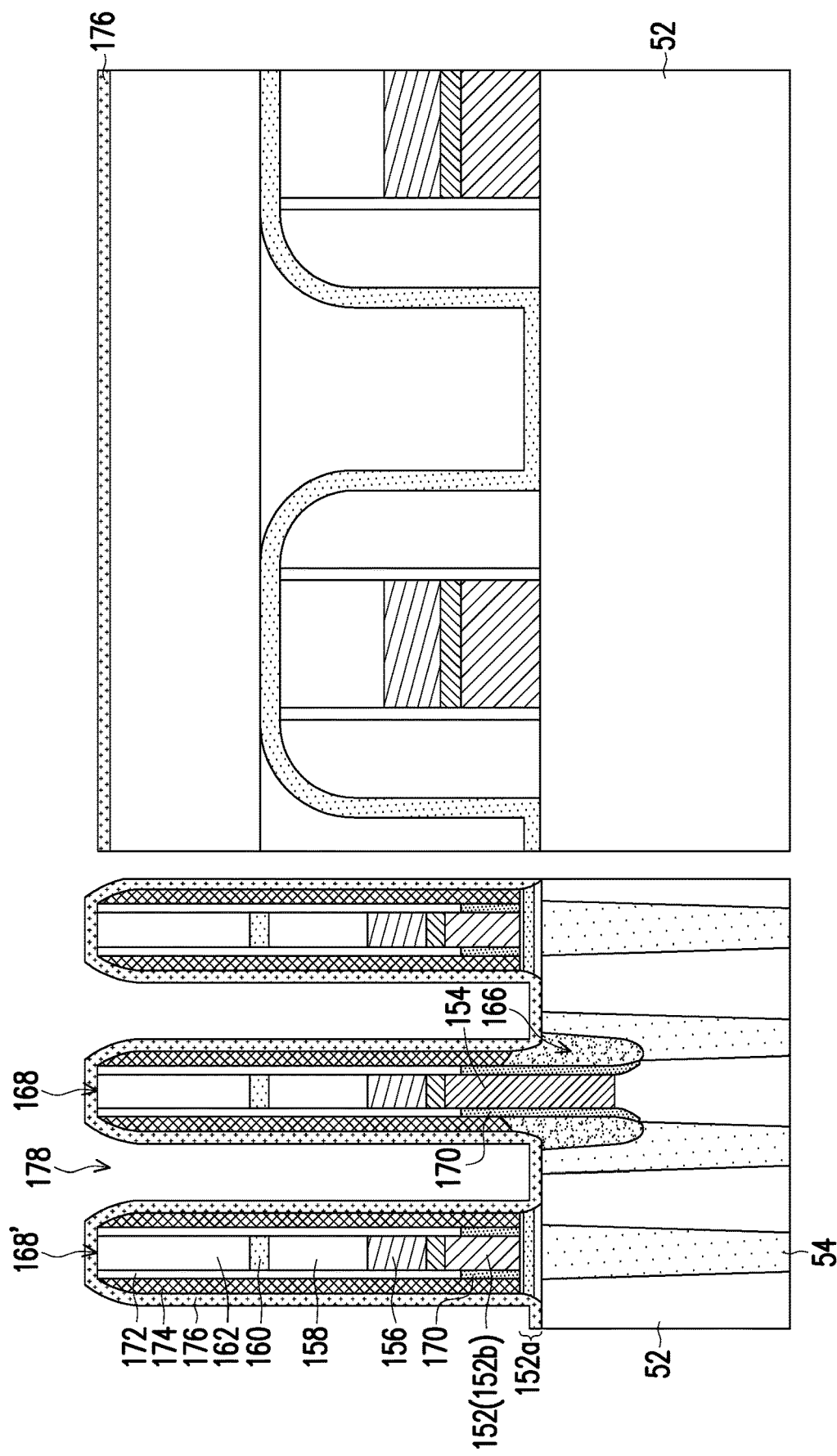

Referring to FIG. 6J, a dielectric layer 176, such as a nitride layer, is further formed over the topological surface of the substrate on the dielectric layer 174. The nitride liner layer 172, the dielectric layer 174 and the dielectric layer 176 together as a stack structure may serve as a part of the insulating layer 270 to isolate the bit line contact structure 154 and the stack layer 380 on the bit line contact structure 154, as also referring to FIG. 4. The opening 164 in this stage is changed to the opening 178.

Referring to FIG. 6K, an oxide layer 240 is formed to fill the opening 178, in which the processing may including coating an oxide layer and curing the oxide layer. Further, a polishing process on the oxide layer is performed, in an example. The polishing process polishes the material at top until the dielectric 176 is exposed.

Figure 6L:
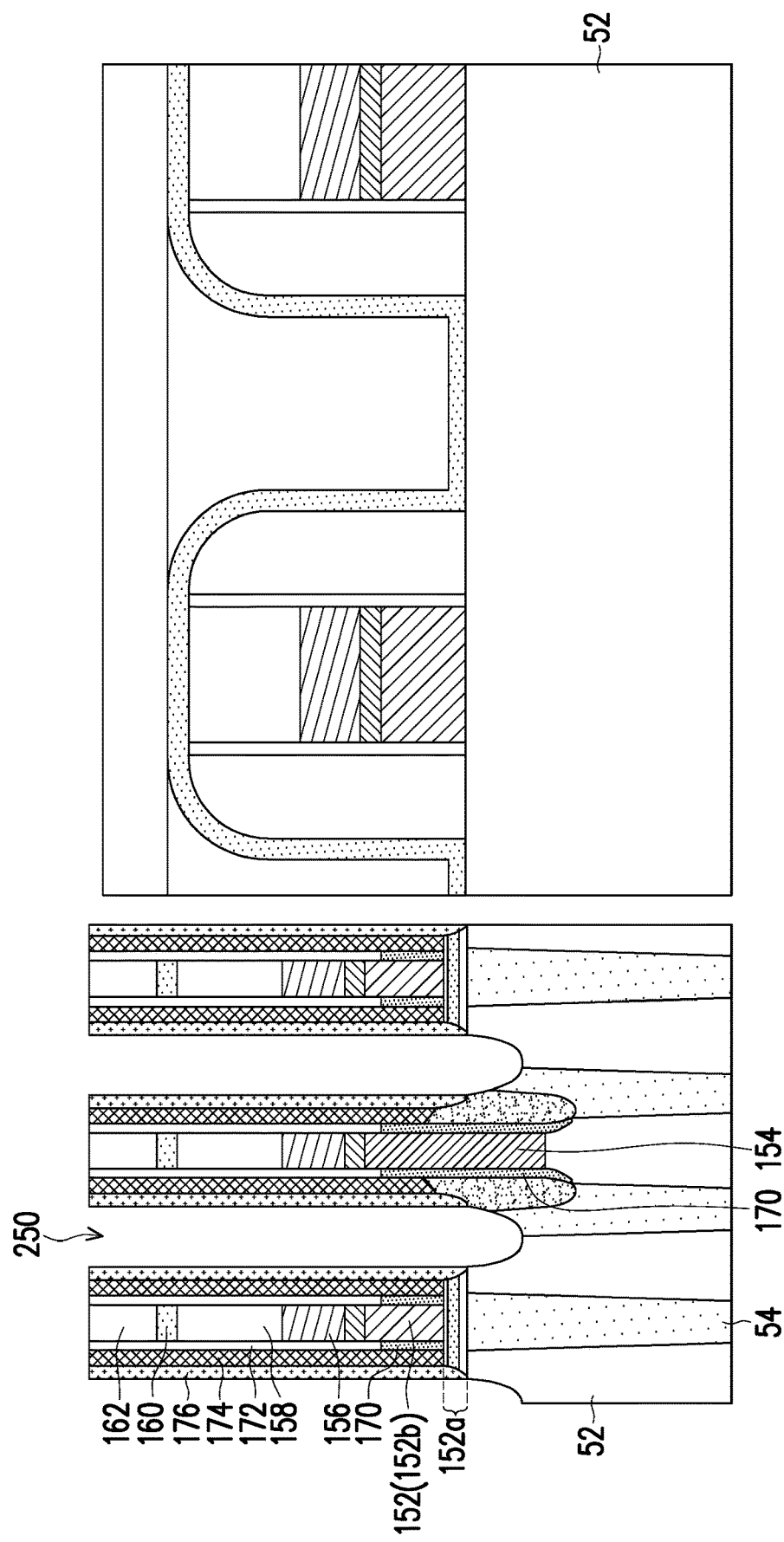

Referring to FIG. 6L, a capacitor contact etching process is subsequently performed to form an opening 250, in which the oxide layer 240 is removed. The opening 250 is preserved to form the capacitor contact structure later. A bottom portion of the opening 250 extends into the substrate at the interface of the active region and the first STI structure 54*a* and the second active region 52*b*.

Figure 6N:
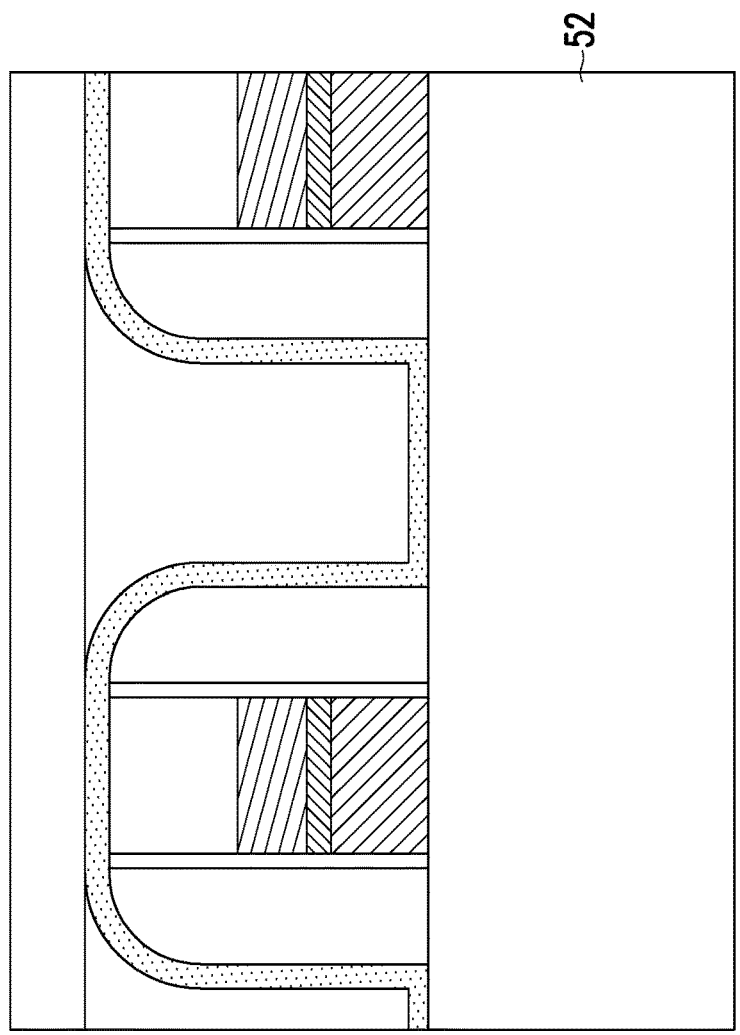
Figure 6P:
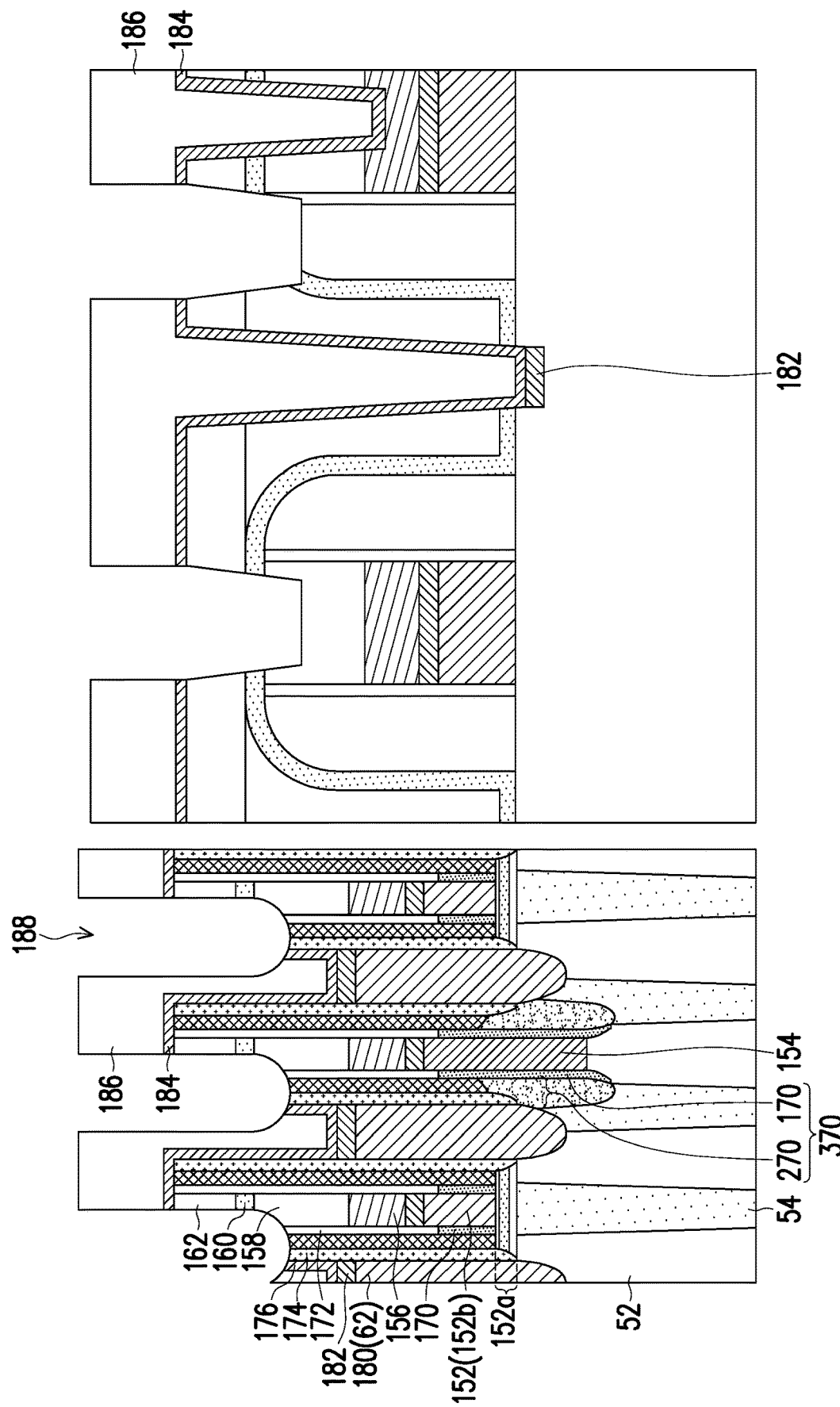

Referring to FIG. 6M, a polysilicon layer with phosphorous doping, as indicated by 180, is formed to fill the opening 250. Referring to FIG. 6N, an etching back process as an example is performed to etch the polysilicon layer. A remaining portion of the polysilicon layer serves as the capacitor contact structure 180. The capacitor contact structure 180 just fills the bottom portion of the opening 250. The opening 250 then becomes the opening 252.

Referring to FIG. 6O, similar to FIG. 5K, a stack layer on the capacitor contact structure 180 is formed. In an embodiment, the $CoSi_x$ layer 182, TiN layer 184 and the interconnect layer 186 as stacked are formed. The same process may be also performed on the peripheral region 35 for interconnection use. However, the invention is not limited to the embodiments.

Referring to FIG. 6P, similar to FIG. 5L, the TiN layer 184 and the interconnect layer 186 with the insulating layer are patterned to have the cutting portion 188 and then individually connected to the capacitor contact structure 180 with the isolation from the insulating layer 270 of the insulating stack layer 370.

In the embodiment, the insulating stack layer 370 includes the dielectric spacer 170 and the insulating layer 270. A portion of the insulating layer 270 between the capacitor contact structure 180 and the bit line contact structure 154, in the embodiment, contain a single nitride layer 179 (see FIG. 6G). However, the dielectric spacer 170 of oxide has smaller dielectric constant and may reduce the parasitic capacitance between the capacitor contact structure 180 and the bit line contact structure 154. In addition, the insulation between the capacitor contact structure 180 and bit line 168' is dominated by dielectric parts of 172(SiN)/174(SiO2)/176(SiN) but the dielectric spacer 170 as the oxide in an embodiment is also included to reduce the bit line parasitic capacitance.

In an embodiment, to further reduce the parasitic capacitance between the capacitor contact structure 180 and the bit line contact structure 154, the dielectric spacer 170 may be replace by ate gap, which may be also treated as a dielectric layer with dielectric constant close to 1.

Figure 7A:
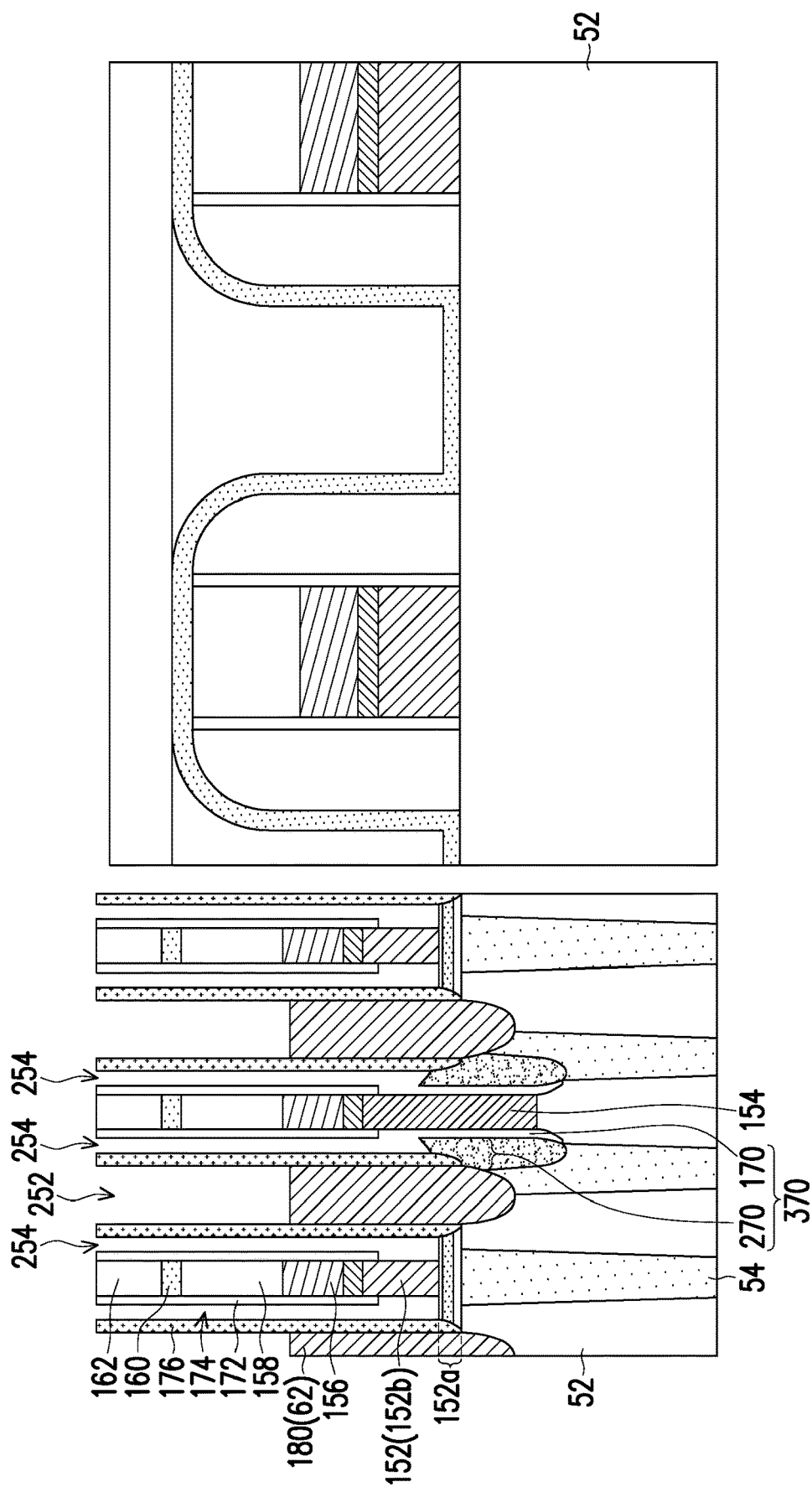
FIG. 7A to FIG. 7B are drawings, schematically illustrating a process flow of a method to fabricate the memory cell as viewed by cross-section structure cutting at the line I-I in FIG. 2.
Figure 7B:
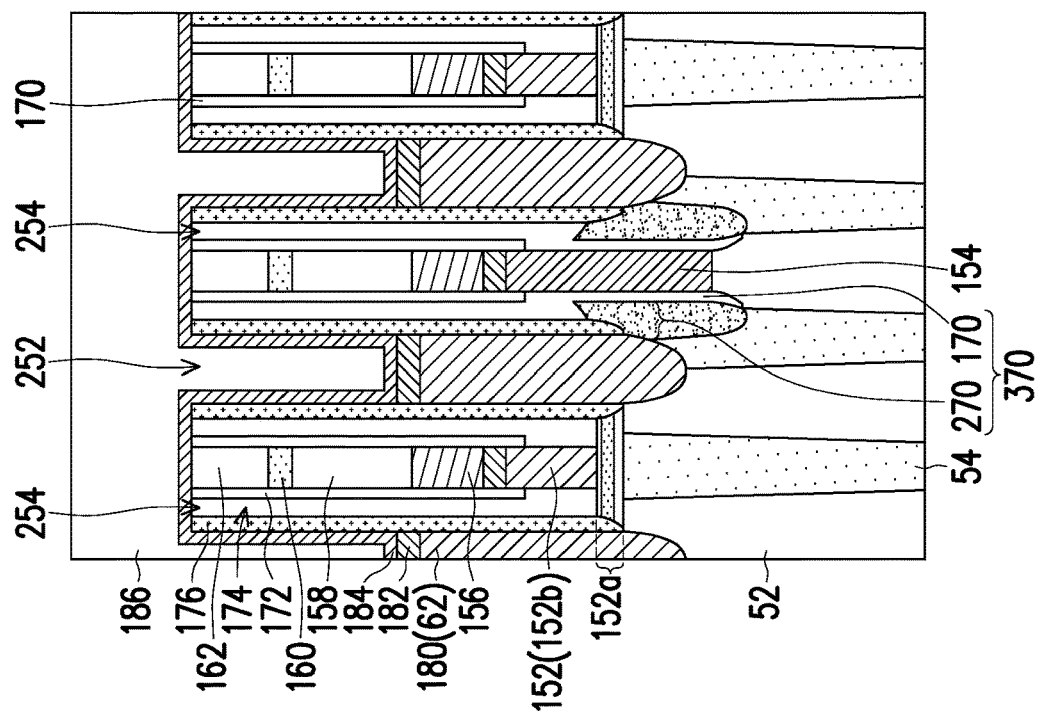

FIG. 7A to FIG. 7B are drawings, schematically illustrating a process flow of a method to fabricate the memory cell as viewed by cross-section structure cutting at the line I-I in FIG. 2. Referring to FIG. 7A, continuing to the structure in FIG. 6N as an example, an oxide etching process is performed to remove the dielectric layer 174, which is oxide as previous stated. Further the dielectric spacer 170 is also oxide and contacts to the dielectric layer 174. As a result, an air gap 254 is formed, including the bottom portion between the capacitor contact structure 180 and the bit line contact structure 154. Then, the dielectric spacer 170 is an air gap with dielectric constant close to 1.

Referring to FIG. 7B, the same process in FIG. 6O are performed to form the $CoSi_x$ layer 182, TiN layer 184 and the interconnect layer 186 as stacked. Since the air gap 254 is narrow, the TiN layer 184 would seal the air gap 254 at the opening end. After then, the same process in FIG. 6P may be subsequently performed.

Further, the air gap 254 is also formed at the sidewall of the polysilicon layer 152*b* of the bit line stack 152 and the dielectric layer 172 for the portion 168', indicated in FIG. 6B. The bit line stack 152.

As noted, the process in FIG. 7A and FIG. 7B on the structure in FIG. 6 O is an example. The same process may also be applied to the structure in FIG. 5J.

The invention forms the dielectric spacer 170 at sidewall of bit line contact structure 154 and the bit line stack 152*b*. The dielectric spacer 170 has less dielectric constant and can at least reduce the parasitic capacitance between the capacitor contact structure 180 and the bit line contact structure 154, besides bit line parasitic capacitance between the capacitor contact structure 180 and bit line 168' too, which are rather close in structure.

It will be apparent to those skilled in the art that various modifications and variations may be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A structure of memory cell, comprising:
a substrate, including a first active region, a second active region and a first shallow trench isolation (STI) structure between the first active region and the second active region, wherein in a cross-section view of the structure of memory cell, a top surface of the first active region is lower than a top surface of the second active region;
a first contact structure, disposed on the first active region;
a first stack structure on the first contact structure;
a second contact structure on the substrate with a bottom portion in the substrate at an interface between the second active region and the first STI structure;
a dielectric spacer at least on a sidewall of the first contact structure; and
an insulating layer, disposed on the dielectric spacer and between the second contact structure and the first contact structure with the first stack structure, wherein a dielectric constant of the dielectric spacer is lower than a dielectric constant of the insulating layer.

2. The structure of memory cell as recited in claim 1, wherein the dielectric spacer comprises an oxide spacer or an air spacer and the insulating layer comprises nitride and has a lower portion and an upper portion.

3. The structure of memory cell as recited in claim 2, wherein the insulating layer comprises the lower portion comprises a nitride part on the dielectric spacer.

4. The structure of memory cell as recited in claim 2, wherein the insulating layer comprises the lower portion comprises a stacked nitride part on the dielectric spacer.

5. The structure of memory cell as recited in claim 4, wherein the stacked nitride part comprises a central nitride and a liner nitride on the central nitride, wherein the liner nitride is contact on the dielectric spacer.

6. The structure of memory cell as recited in claim 2, wherein insulating layer comprises the upper portion also abuts to the dielectric spacer and is between the first contact structure with the first stack structure and the second contact structure.

7. The structure of memory cell as recited in claim 6, wherein the upper portion comprises a nitride part on the dielectric spacer and a sidewall of the first stacked structure.

8. The structure of memory cell as recited in claim 6, wherein the upper portion comprises a stack nitride part on the dielectric spacer and a sidewall of the first stacked structure.

9. The structure of memory cell as recited in claim 8, wherein the stack nitride part comprises a liner nitride.

10. The structure of memory cell as recited in claim 8, wherein the stack nitride part also comprises an air part.

11. The structure of memory cell as recited in claim 1, wherein the first contact structure is a bit line contact structure and the second contact structure is a capacitor contact structure.

12. The structure of memory cell as recited in claim 1, wherein the first stack layer comprises a conductive stack part at bottom and a mask part at top.

13. The structure of memory cell as recited in claim 12, wherein the conductive stack part comprises a barrier layer and a tungsten layer as stacked.

14. The structure of memory cell as recited in claim 1, further comprises a second stack structure on the second contact structure.

15. The structure of memory cell as recited in claim 14, wherein the second stack structure comprises a CoSix layer, a barrier layer, tungsten layer, and a portion of interconnection structure.

16. The structure of memory cell as recited in claim 1, further comprising:
a second STI structure in the substrate at a side of the second active region;
a bit line stack above the second STI structure; and
a stack spacer on a sidewall of the bit line stack.

17. The structure of memory cell as recited in claim 16, wherein the bit line stack comprises, an insulating bottom, a polysilicon layer, a barrier layer, and tungsten as stacked.

18. The structure of memory cell as recited in claim 17, wherein the stack spacer comprises an oxide spacer on a sidewall of the polysilicon layer.

19. The structure of memory cell as recited in claim 18, wherein the dielectric spacer on the sidewall of the bit line stack also comprises a nitride spacer on the oxide spacer.

20. The structure of memory cell as recited in claim 16, wherein the dielectric spacer on the sidewall of the bit line stack comprises a nitride part and an air part in the nitride part, wherein a sidewall of the polysilicon layer is exposed by the air part.

* * * * *